(12) United States Patent
Kim

(10) Patent No.: US 7,495,488 B2
(45) Date of Patent: Feb. 24, 2009

(54) PHASE-LOCKED LOOP CIRCUIT, DELAY-LOCKED LOOP CIRCUIT AND METHOD OF TUNING OUTPUT FREQUENCIES OF THE SAME

(75) Inventor: Woo-Seok Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 39 days.

(21) Appl. No.: 11/712,034

(22) Filed: Feb. 28, 2007

(65) Prior Publication Data
US 2007/0205816 A1 Sep. 6, 2007

(30) Foreign Application Priority Data
Mar. 4, 2006 (KR) ............... 10-2006-0020691

(51) Int. Cl.
*H03L 7/06* (2006.01)
(52) U.S. Cl. .............. 327/159; 327/141; 327/155; 327/157
(58) Field of Classification Search ........... 327/141, 327/144–163; 375/373–376; 331/15–17
See application file for complete search history.

(56) References Cited

U.S. PATENT DOCUMENTS

| | | | | |
|---|---|---|---|---|
| 5,923,196 | A | * | 7/1999 | Okamoto ............... 327/156 |
| 6,870,411 | B2 | * | 3/2005 | Shibahara et al. ........ 327/156 |
| 7,154,348 | B2 | | 12/2006 | Lee et al. |

FOREIGN PATENT DOCUMENTS

| | | |
|---|---|---|
| JP | 2000-49597 | 2/2000 |
| JP | 2002-111492 | 4/2002 |
| JP | 2003-78410 | 3/2003 |
| KR | 10-2005-0037304 | 4/2005 |

* cited by examiner

*Primary Examiner*—Long Nguyen
*Assistant Examiner*—Brandon S Cole
(74) *Attorney, Agent, or Firm*—Mills & Onello, LLP

(57) ABSTRACT

A phase-locked loop (PLL) circuit includes a phase/frequency detector (PFD), a charge pump, a loop filter, a control circuit, a VCO, and a feedback circuit. The control circuit generates a digital control signal in response to the up signal, the down signal, and the oscillation-control voltage. The VCO generates an output signal of which a frequency is changed in response to the oscillation-control voltage and the digital control signal. Accordingly, the PLL circuit can automatically tune the frequency of the output signal of a VCO using a digital circuit having a simple structure.

21 Claims, 24 Drawing Sheets

PHASE-LOCKED LOOP CIRCUIT, DELAY-LOCKED LOOP CIRCUIT AND METHOD OF TUNING OUTPUT FREQUENCIES OF THE SAME

CROSS-REFERENCE TO RELATED APPLICATIONS

This application claims priority under 35 USC § 119 to Korean Patent Application No. 10-2006-0020691, filed on Mar. 4, 2006 in the Korean Intellectual Property Office (KIPO), the disclosure of which is incorporated herein in its entirety by reference.

BACKGROUND OF THE INVENTION

1. Field of the Invention

The present invention relates to frequency tuning, and more particularly to a phase-locked loop (PLL) circuit having a voltage-controlled oscillator (VCO) and a delay-locked loop (DLL) circuit having a voltage-controlled delay line (VCDL) and methods of tuning output frequencies of the PLL and the DLL.

2. Description of the Related Art

Phase-locked loop (PLL) circuits are widely used to synchronize clocks that are applied to circuit blocks. PLL circuits are used in various electronic systems including, for example, communication systems, multimedia systems, and in various other applications such as frequency modulation (FM) demodulators, clock recovery circuits, tone decoders, etc.

The PLL circuits commonly include a voltage-controlled oscillator (VCO). The operating characteristics of the VCO can have a significant impact on the performance of both the PLL and the system in which the PLL is employed. In many applications, the frequency range of a clock generated by the PLL may be determined depending on the frequency range of an output signal of the VCO.

FIG. 1 is a graph illustrating frequency characteristics of an output signal of a VCO according to operating conditions in a conventional PLL circuit.

As illustrated in FIG. 1, the output signal of a VCO may have different frequency curves according to operating conditions such as process, voltage, and temperature. In the best conditions, the output signal of a VCO may have a higher frequency than the frequency in typical conditions. In the worst conditions, the output signal of a VCO may have a lower frequency than the frequency in the typical conditions. In FIG. 1, VH denotes an upper limit voltage that the oscillation-control voltage VCON may have, and VL denotes a lower limit voltage that the oscillation-control voltage VCON may have.

In the conventional art, changes in VCO characteristics may be compensated for by a temperature-compensating circuit included in the PLL circuit or by securing an increased design margin. However, the temperature compensating circuit may not compensate for changes in VCO characteristics when a fabrication process is changed, and when the design margin has a limit. Further, the operation speed of the VCO should be decreased in order to cover the minimum operational frequency under the best conditions. On the contrary, the operation speed of a VCO should be increased in order to cover the maximum operational frequency under the worst conditions.

Accordingly, a PLL circuit capable of securing a maximum frequency and a minimum frequency regardless of the changes in operating conditions is required.

SUMMARY OF THE INVENTION

Accordingly, the present invention is provided to substantially obviate one or more problems due to the limitations and disadvantages of the related art.

Some embodiments of the present invention provide a voltage-controlled oscillator (VCO) that can secure a maximum operating frequency and a minimum operating frequency regardless of changes in operating conditions.

Some embodiments of the present invention provide a phase-locked loop (PLL) circuit including a VCO that can secure a maximum operating frequency and a minimum operating frequency regardless of changes in operating conditions.

Some embodiments of the present invention provide a method of controlling a VCO that can secure a maximum operating frequency and a minimum operating frequency regardless of changes in operating conditions.

Some embodiments of the present invention provide a method of tuning an oscillation frequency that can secure a maximum operating frequency and a minimum operating frequency regardless of the changes in operating conditions.

Some embodiments of the present invention provide a delay-locked loop (DLL) circuit capable of automatically tuning a delay time of a voltage-controlled delay line (VCDL).

In one aspect, a PLL circuit includes a phase/frequency detector (PFD), a charge pump, a loop filter, a control circuit, a VCO, and a feedback circuit. The PFD generates an up signal and a down signal in response to a phase difference and a frequency difference between a reference signal or a feedback signal. The charge pump generates a first voltage signal that is changed in response to the up signal and the down signal. The loop filter filters the first voltage signal to generate an oscillation-control voltage. The control circuit generates a digital control signal in response to the up signal, the down signal, and the oscillation-control voltage. The VCO generates an output signal, a frequency of the output signal being changed in response to the oscillation-control voltage and the digital control signal. The feedback circuit generates the feedback signal in response to the output signal.

In one embodiment, the control circuit includes a control voltage range detecting circuit, a frequency-change detecting circuit, and a shift register. The control voltage range detecting circuit may set an upper limit voltage and a lower limit voltage, and compares the oscillation-control voltage with the upper limit voltage and the lower limit voltage to generate a voltage range detecting signal. The frequency-change detecting circuit may compare the up signal and the down signal to generate a pulse signal. The shift register generates the digital control signal in response to the voltage range detecting signal and the pulse signal.

In another embodiment, the frequency-change detecting circuit is configured to generate the pulse signal when a pulse width of the up signal is wider than a pulse width of the down signal.

In another embodiment, the upper limit voltage and the lower limit voltage are set in response to a threshold voltage of a metal-oxide semiconductor (MOS) transistor.

In another embodiment, the voltage range detecting signal has a first logic state when the oscillation control signal has a voltage lower than the lower limit voltage and a second logic state when the oscillation control signal has a voltage greater than the upper limit voltage, and wherein the voltage range detecting signal maintains a previous logic state when the oscillation control signal has a voltage greater than or equal to the lower limit voltage or when the oscillation control signal has a voltage lower than or equal to the upper limit voltage.

In another embodiment, the control voltage range detecting circuit comprises: a first inverter having a first transition threshold voltage substantially the same as the upper limit voltage, and configured to invert the oscillation-control voltage; a second inverter configured to invert an output signal of the first inverter; a third inverter having a second transition threshold voltage substantially the same as the lower limit voltage, and configured to invert the oscillation-control voltage; a fourth inverter configured to invert an output signal of the third inverter; an XNOR gate configured to execute a logical XNOR operation on an output signal of the second inverter and the output signal of the fourth inverter; and a latch circuit configured to latch an output signal of the fourth inverter in response to an output signal of the XNOR gate.

In another embodiment, the first inverter includes a first PMOS transistor and a first NMOS transistor, and the second inverter includes a second PMOS transistor and a second NMOS transistor, the first PMOS transistor having a threshold voltage lower than the threshold voltage of the second PMOS transistor, the second NMOS transistor having a threshold voltage lower than the threshold voltage of the first NMOS transistor.

In another embodiment, the frequency-change detecting circuit comprises: a delay circuit configured to delay the up signal; a flip-flop configured to generate a first signal in response to the down signal and an output signal of the delay circuit; an OR gate configured to execute a logical OR operation on the output signal of the delay circuit and the down signal; and an AND gate configured to execute a logical AND operation on the first signal and an output signal of the OR gate.

In another embodiment, the VCO can include a bias circuit, a compensating circuit, and an oscillating circuit. The bias circuit generates a bias voltage that is changed in response to the oscillation-control voltage. The compensating circuit changes the bias voltage in response to the digital control signal. The oscillating circuit generates the output signal in response to the bias voltage.

In another embodiment, the compensating circuit comprises: at least one current source having a first terminal to which a first supply voltage is applied; and at least one switch coupled between a second terminal of each of the at least one current sources and the bias circuit, and configured to be turned on in response to one bit of the digital control signal.

In another aspect, a VCO includes a control circuit, a bias circuit, a compensating circuit and an oscillating circuit. The control circuit generates a digital control signal in response to an up signal, a down signal, and an oscillation-control voltage. The bias circuit generates a bias voltage that is changed in response to the oscillation-control voltage. The compensating circuit changes the bias voltage in response to the digital control signal. The oscillating circuit generates an output signal, in which a frequency of the output signal is changed in response to the bias voltage.

In one embodiment, the compensating circuit comprises: at least one current source having a first terminal to which a first supply voltage is applied; and at least one switch coupled between a second terminal of each of the at least one current sources and the bias circuit, and configured to be turned on in response to one bit of the digital control signal.

In another embodiment, the control circuit comprises: a control voltage range detecting circuit configured to set an upper limit voltage and a lower limit voltage and to compare the oscillation-control voltage with the upper limit voltage and the lower limit voltage to generate a voltage range detecting signal; a frequency-change detecting circuit configured to compare the up signal and the down signal to generate a pulse signal; and a shift register configured to enable the digital control signal in response to the voltage range detecting signal and the pulse signal.

In another embodiment, the frequency-change detecting circuit is configured to generate the pulse signal when a pulse width of the up signal is wider than a pulse width of the down signal.

In another embodiment, the upper limit voltage and the lower limit voltage are set in response to a threshold voltage of a MOS transistor.

In another embodiment, the voltage range detecting signal has a first logic state when the oscillation control signal has a voltage lower than the lower limit voltage and a second logic state when the oscillation control signal has a voltage greater than the upper limit voltage, and wherein the voltage range detecting signal maintains a previous logic state when the oscillation control signal has a voltage greater than or equal to the lower limit voltage or when the oscillation control signal has a voltage lower than or equal to the upper limit voltage.

In another embodiment, the control voltage range detecting circuit comprises: a first inverter having a first transition threshold voltage substantially the same as the upper limit voltage, and configured to invert the oscillation-control voltage; a second inverter configured to invert an output signal of the first inverter; a third inverter having a second transition threshold voltage substantially the same as the lower limit voltage, and configured to invert the oscillation-control voltage; a fourth inverter configured to invert an output signal of the third inverter; an XNOR gate configured to execute a logical XNOR operation on an output signal of the second inverter and the output signal of the third inverter; and a latch circuit configured to latch an output signal of the fourth inverter in response to an output signal of the XNOR gate.

In another embodiment, the first inverter includes a first PMOS transistor and a first NMOS transistor, and the second inverter includes a second PMOS transistor and a second NMOS transistor, the first PMOS transistor having a threshold voltage lower than the threshold voltage of the second PMOS transistor, the second NMOS transistor having a threshold voltage lower than the threshold voltage of the first NMOS transistor.

In another embodiment, the frequency-change detecting circuit comprises: a delay circuit configured to delay the up signal; a flip-flop configured to generate a first signal in response to the down signal and an output signal of the delay circuit; an OR gate configured to execute a logical OR operation on the output signal of the delay circuit and the down signal; and an AND gate configured to execute a logical AND operation on the first signal and an output signal of the OR gate.

In another aspect, a method of controlling a PLL circuit includes generating an up signal and down signal in response to a phase difference and a frequency difference between a reference signal or a feedback signal; generating a first voltage signal that is changed in response to the up signal and the down signal; filtering the first voltage signal to generate an oscillation-control voltage; generating a digital control signal in response to the up signal, the down signal, and the oscillation-control voltage; generating an output signal by controlling a frequency of the output signal in response to the oscillation-control voltage and the digital control signal; and generating the feedback signal in response to the output signal.

In another aspect, a method of tuning an oscillation frequency includes comparing an oscillation-control voltage with an upper limit voltage; setting an output signal of a control voltage range detecting circuit to a logic value of '1' when the oscillation-control voltage is greater than the upper limit voltage; comparing the oscillation-control voltage with the lower limit voltage; setting the output signal of the control voltage range detecting circuit to a logic value of '0' when the oscillation-control voltage is lower than the lower limit voltage; maintaining a present logic state of the output signal of the control voltage range detecting circuit when the oscillation-control voltage is greater than or equal to the lower limit voltage; determining whether first to (N-1)th bits of a digital control signal of N-bit have a logic value of '1', where N is a positive integer; setting an Nth bit of the digital control signal to a logic value of '0' when all of the first to (N-1)th bits of the digital control signal are not a logic value of '1'; determining whether an output signal of the control voltage range detecting circuit has a logic value of '1'; setting the Nth bit of the digital control signal to a logic value of '0' when the output signal of the control voltage range detecting circuit does not have a logic value of '1'; determining whether the oscillation-control voltage is greater than the upper limit voltage; setting the Nth bit of the digital control signal to a logic value of '1' when the oscillation-control voltage is greater than the upper limit voltage; and maintaining a present logic state of the Nth bit of the digital control signal when the oscillation-control voltage is not greater than the upper limit voltage.

In one embodiment, the method may further include tuning an oscillation frequency by applying the digital control signal to the VCO.

In another aspect, a DLL circuit includes a phase detector, a charge pump, a loop filter, a control circuit, a voltage-controlled delay line, and a feedback path. The phase detector generates an up signal and down signal in response to a phase difference between a reference signal and a feedback signal. The charge pump generates a first voltage signal that is changed in response to the up signal and the down signal. The loop filter filters the first voltage signal to generate an oscillation-control voltage. The control circuit generates a digital control signal in response to the up signal, the down signal, and the oscillation-control voltage. The voltage-controlled delay line generates an output signal. A delay time of the output signal is changed in response to the oscillation-control voltage and the digital control signal. The feedback path generates the feedback signal in response to the output signal.

Therefore, the PLL circuit and the DLL circuit according to the present invention include a control circuit that automatically tunes the oscillation frequency of the output signal of the VCO.

BRIEF DESCRIPTION OF THE DRAWINGS

The foregoing and other objects, features and advantages will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the embodiments of the invention.

DETAILED DESCRIPTION OF EMBODIMENTS

Figure 1:
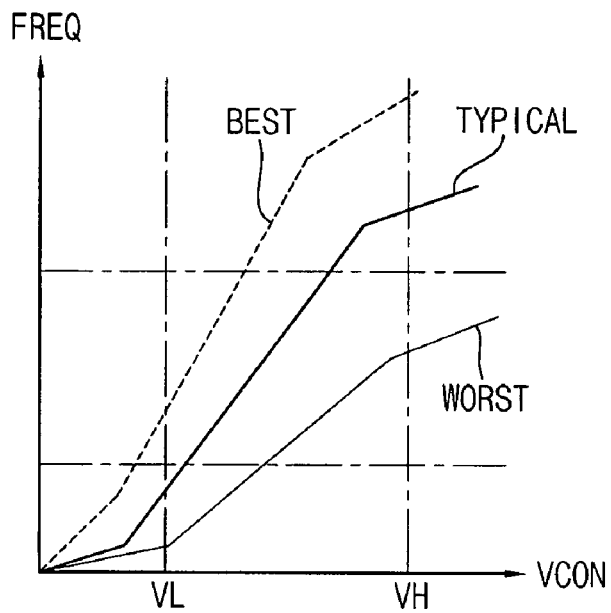
FIG. 1 is a graph illustrating frequency characteristics of an output signal of a voltage-controlled oscillator (VCO) according to operating conditions in a conventional phase-locked loop (PLL) circuit.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
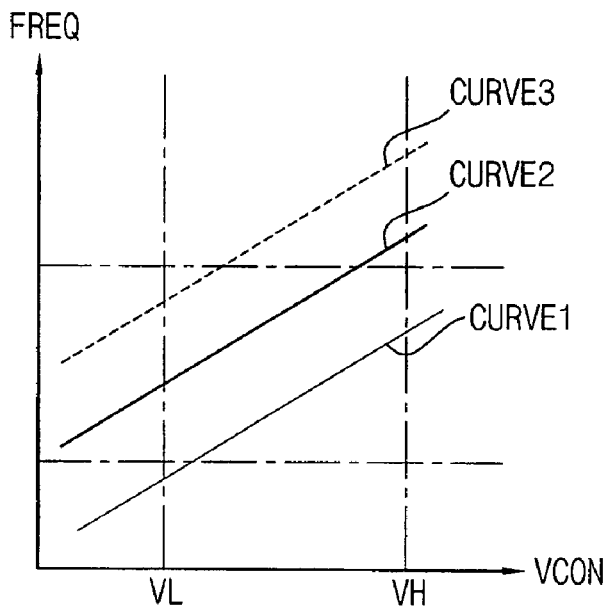
FIG. 2 is a graph illustrating output signals of a VCO according to operating conditions in a PLL circuit.

FIG. 2 is a graph illustrating output signals of a voltage-controlled oscillator (VCO) according to operating conditions in a phase-locked loop circuit.

In FIG. 2, three curves CURVE1, CURVE2, and CURVE3 according to different operating conditions are shown with respect to oscillation-control voltage VCON. A frequency on the CURVE3 is greater than a frequency on the CURVE2, and a frequency on the CURVE1 is lower than a frequency on the CURVE2. In the PLL circuit according to embodiments of the present invention, a frequency of an output signal of the VCO may automatically move along the curves CURVE1, CURVE2, and CURVE3 according to operating conditions to include a maximum frequency and a minimum frequency. Operation along one of a plurality of curves may be selected by a digital control signal as will be described later.

Figure 3:
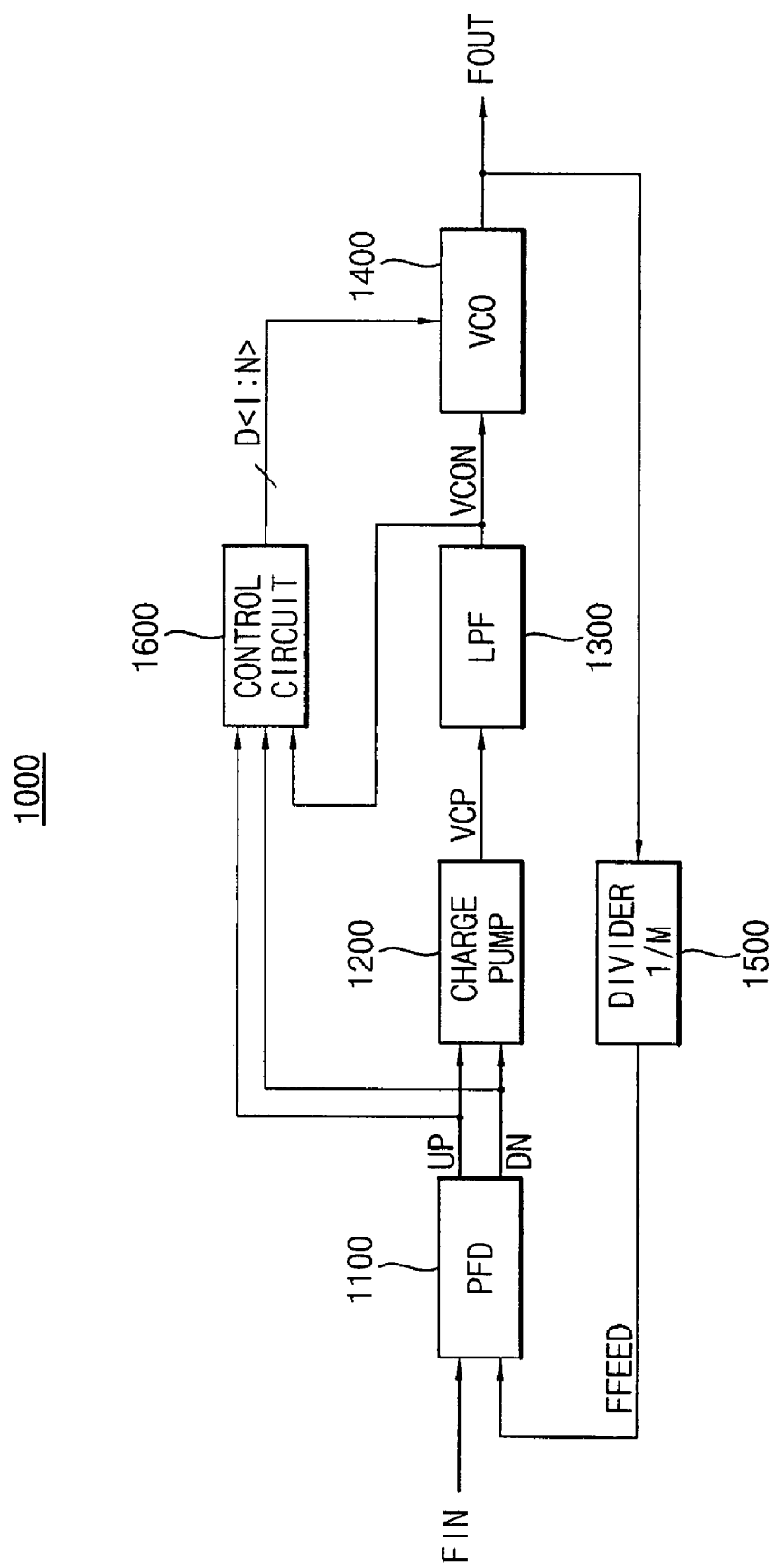
FIG. 3 is a block diagram illustrating a PLL circuit according to an example embodiment of the present invention.

FIG. 3 is a block diagram illustrating a phase-locked loop (PLL) circuit according to an example embodiment of the present invention.

Referring to FIG. 3, a PLL circuit 1000 includes a phase/frequency detector (PFD) 1100, a charge pump 1200, a loop filter 1300, a VCO 1400, a frequency divider 1500, and a control circuit 1600.

The PFD 1100 generates an up signal UP and a down signal DN based on a phase difference and a frequency difference between a reference signal FIN and a feedback signal FFEED. The charge pump 1200 generates a first voltage signal VCP of which a voltage level is changed in response to the up signal UP and the down signal DN. The loop filter 1300 filters the first voltage signal to generate an oscillation-control voltage VCON. High frequency components of the first voltage signal VCP are removed by the loop filter 1300. The VCO 1400 generates an output signal FOUT that oscillates. The frequency of the output signal FOUT is changed based on the oscillation-control voltage VCON and a digital control signal D<1:N>. The frequency divider 1600 divides a frequency of the output signal FOUT to generate the feedback signal FFEED. The feedback signal FFEED is applied to an input terminal of the PFD. The control circuit 1600 generates a digital control signal D<1:N> based on the up signal, the down signal, and the oscillation-control voltage VCON.

Figure 4:
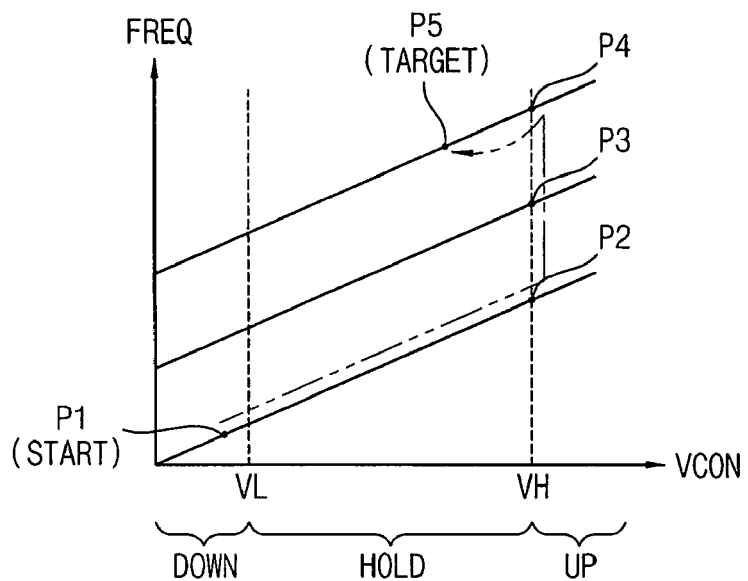
FIG. 4 and FIG. 5 are graphs illustrating traces of an output signal of a VCO in frequency curves when a voltage of an output signal of a control circuit in FIG. 3 is changed.
Figure 5:
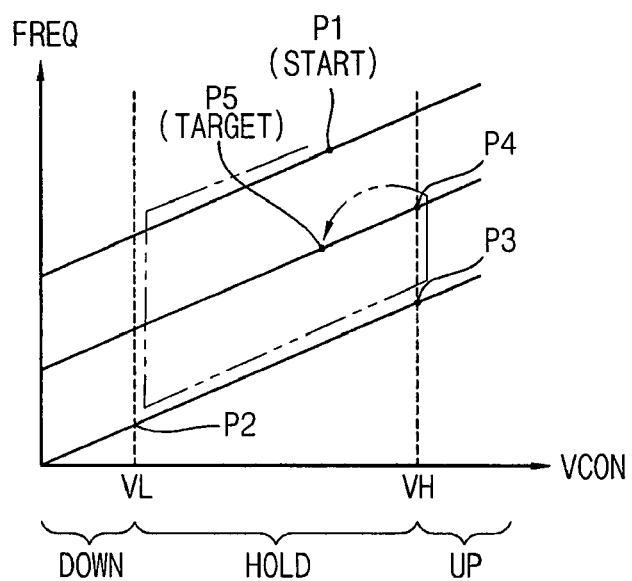

FIG. 4 and FIG. 5 are graphs illustrating traces of an output signal of a VCO in frequency curves when a voltage of an output signal of a control circuit in FIG. 3 is changed.

In FIG. 4 and FIG. 5, VH denotes an upper limit voltage that the oscillation-control voltage VCON may have, and VL denotes a lower limit voltage that the oscillation-control voltage VCON may have. FIG. 4 and FIG. 5 illustrate traces of an output signal of a VCO in frequency curves when a starting point is point P1 and a target point is point P5.

FIG. 4 illustrates a shifting process of an output signal FOUT of a VCO 1400 along frequency curves when a frequency of the target point is greater than a frequency of the starting point. The oscillation-control voltage VCON approaches the upper limit voltage VH when the output signal FOUT of the VCO 1400 approaches point P2. When the oscillation-control voltage VCON approaches the upper limit voltage VH, the VCO curve is shifted to a curve on which point P3 is included by the control circuit 1600 included in the PLL 1000 shown in FIG. 3. At point P3, the oscillation-control voltage VCON needs to be additionally increased to further approach the target point. Therefore, the output signal FOUT of the VCO 1400 is shifted to point P4 by the control circuit 1600. Thereafter, the output signal FOUT of the VCO 1400 is shifted to point P5 by a tracking operation of the PLL. The frequency of point P5 becomes a lock frequency.

FIG. 5 illustrates a shifting process of an output signal FOUT of a VCO 1400 along frequency curves when a frequency of the target point is lower than a frequency of the starting point. In this example, the oscillation-control voltage VCON decreases to VL by the tracking operation of the PLL because point P1 is located along the curve that has the highest frequency characteristics. Then, the output signal FOUT of a VCO 1400 is shifted to point P2 that is on the curve having the lowest frequency among the VCO characteristic curve by the control circuit 1600 included in the PLL 1000 shown in FIG. 3. Then, the oscillation-control voltage VCON approaches the upper limit voltage VH when the output signal FOUT of the VCO 1400 approaches point P3. When the oscillation-control voltage VCON approaches the upper limit voltage VH, the VCO curve is shifted to a curve on which point P4 is included by the control circuit 1600 included in the PLL 1000 shown in FIG. 3. Then, the output signal FOUT of the VCO 1400 is shifted from point P4 to point P5 by the tracking operation of the PLL. The frequency of point P5 becomes a lock frequency.

Figure 6:
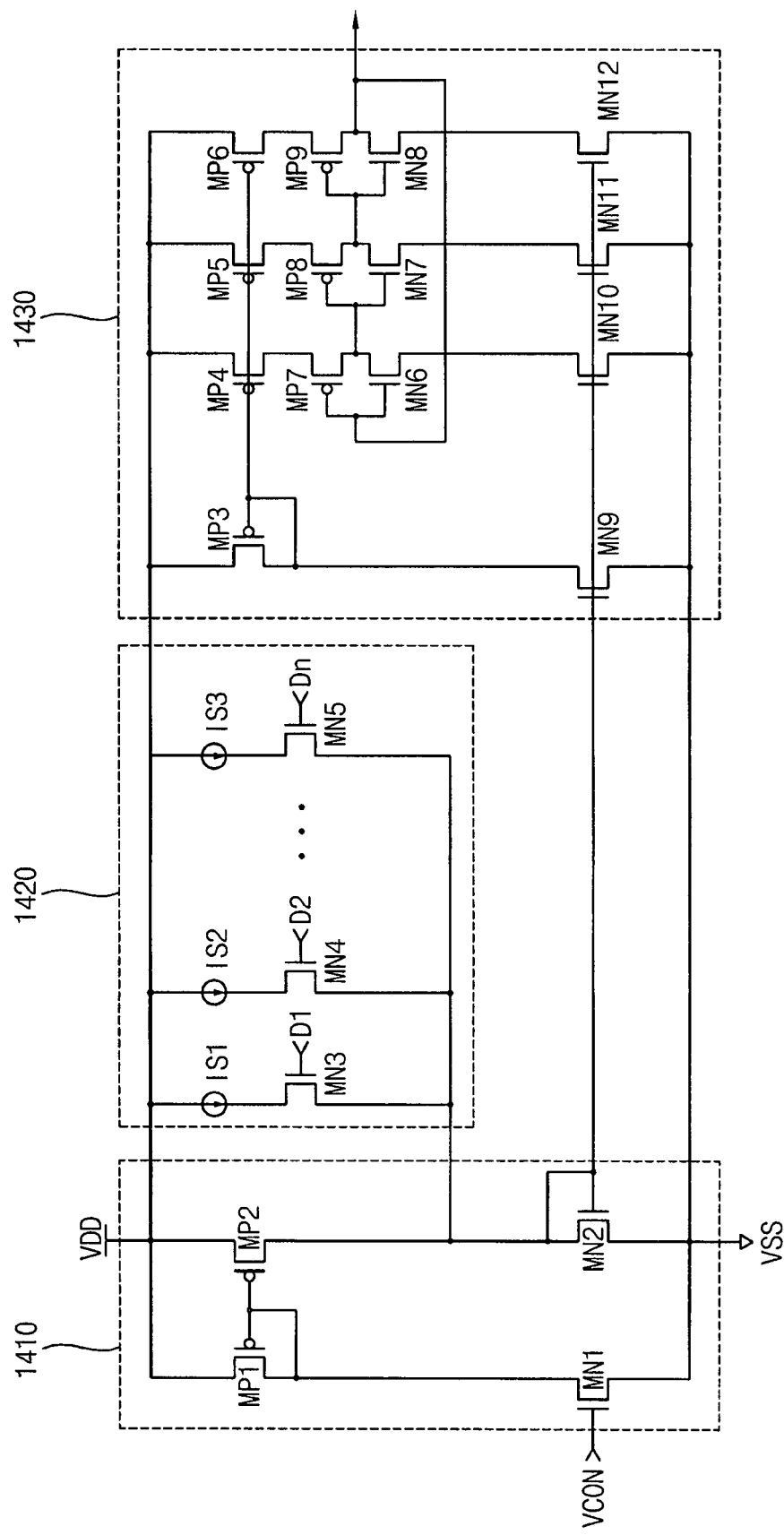
FIG. 6 is a circuit diagram illustrating an example embodiment of a VCO included in the PLL circuit of FIG. 3.

FIG. 6 is a circuit diagram illustrating an example embodiment of a VCO included in the PLL circuit of FIG. 3.

Referring to FIG. 6, the VCO 1400 includes a bias circuit 1410, a compensating circuit 1420, and an oscillating circuit 1430.

The bias circuit 1410 generates a bias voltage that changes in response to the oscillation-control voltage VCON. The compensating circuit 1420 changes the bias voltage based on digital control signals D1 to Dn. The oscillating circuit 1430 generates the output signal FOUT in response to the bias voltage. The digital control signals D1 to Dn are represented by the output signal D<1:n> of the control circuit 1600.

The bias circuit 1410 includes a first p-type metal-oxide semiconductor (PMOS) transistor MP1, a second PMOS transistor MP2, a first n-type MOS (NMOS) transistor MN1, and a second NMOS transistor MN2. The first PMOS transistor MP1 has a source coupled to a high supply voltage VDD, and a gate and a drain of the first PMOS transistor MP1 are electrically coupled. The second PMOS transistor MP2 has a source coupled to the high supply voltage VDD, and a gate coupled to the gate of the first PMOS transistor MP1. The first NMOS transistor MN1 has a gate to which the oscillation-control voltage VCON is applied, a drain coupled to the drain of the first PMOS transistor MP1, and a source coupled to a low supply voltage VSS. The second NMOS transistor MN2 has a drain and a gate commonly coupled to a drain of the PMOS transistor MP2, and a source coupled to the low supply voltage VSS.

The compensating circuit 1420 includes current sources IS1, IS2, and IS3, and third, fourth and fifth NMOS transistors MN3, MN4, and MN5.

Each of the current sources IS1, IS2, and IS3 has a first terminal coupled to the high supply voltage VDD. Each of the third, fourth and fifth NMOS transistors MN3, MN4, and MN5 is coupled between a second terminal of each of the current sources IS1, IS2, and IS3 and the drain of the PMOS transistor MP2. Each of the third, fourth and fifth NMOS transistors MN3, MN4, and MN5 is turned on and turned off in response to the digital control signals D1 to Dn.

The oscillating circuit 1430 includes a third PMOS transistor MP3, a fourth PMOS transistor MP4, a fifth PMOS transistor MP5, a sixth PMOS transistor MP6, a seventh PMOS transistor MP7, an eighth PMOS transistor MP8, and a ninth PMOS transistor MP9. Further, the oscillating circuit 1430 includes a sixth NMOS transistor MN6, a seventh NMOS transistor MN7, an eighth NMOS transistor MN8, a ninth NMOS transistor MN9, a tenth NMOS transistor MN10, an eleventh NMOS transistor MN11, and a twelfth NMOS transistor MN12. The third PMOS transistor MP3, the fourth PMOS transistor MP4, the fifth PMOS transistor MP5, and the sixth PMOS transistor MP6 are coupled to each other in a current-mirror configuration. The ninth NMOS transistor MN9, the tenth NMOS transistor MN10, the eleventh NMOS transistor MN11, and the twelfth NMOS transistor MN12 are coupled to each other in a current-mirror configuration. The seventh PMOS transistor MP7 and the sixth NMOS transistor MN6 constitute an inverter. The eighth PMOS transistor MP8 and the seventh NMOS transistor MN7 constitute an inverter. The ninth PMOS transistor MP9 and an eighth NMOS transistor MN8 constitute an inverter. An input terminal of the inverter that is comprised of the seventh PMOS transistor MP7 and the sixth NMOS transistor MN6 is electrically coupled to an output terminal of the inverter that is comprised of the ninth PMOS transistor MP9 and an eighth NMOS transistor MN8, and the output of this inverter is the output voltage signal FOUT.

Therefore, the bias voltage is controlled by the digital control signal D1 to Dn and the output voltage FOUT of the oscillating circuit 1430 oscillates according to the bias voltage input to the gates of the transistors MN9 through MN12.

Figure 7:
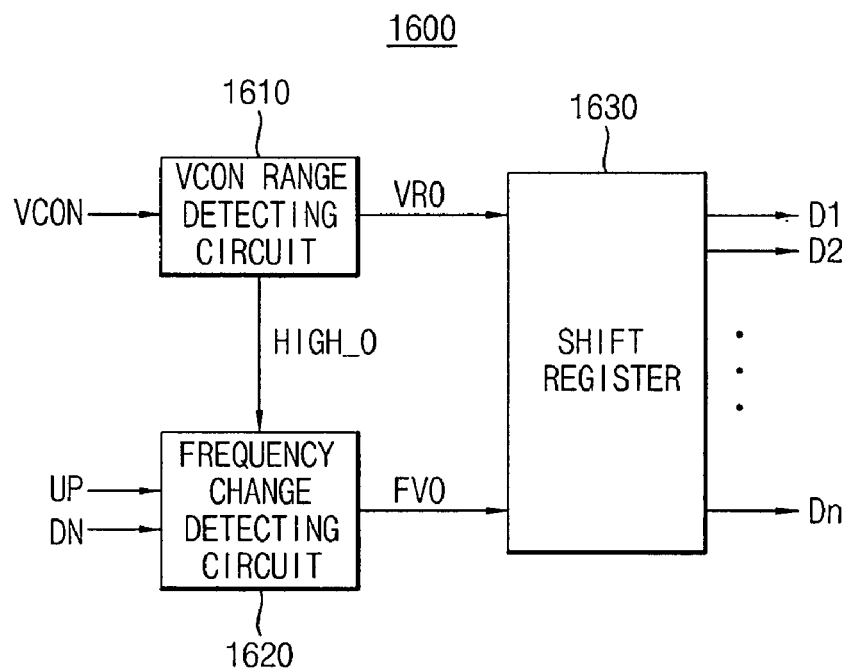
FIG. 7 is a block diagram illustrating an example embodiment of a control circuit included in the PLL circuit of FIG. 3.

FIG. 7 is a block diagram illustrating an example embodiment of a control circuit included in the PLL circuit of FIG. 3.

Referring to FIG. 7, the control circuit 1600 includes a control voltage range detecting circuit 1610, a frequency-change detecting circuit 1620, and a shift register 1630.

The control voltage range detecting circuit 1610 sets an upper limit voltage VH and a lower limit voltage VL, and compares the oscillation-control voltage VCON with the upper limit voltage VH and the lower limit voltage VL to generate a voltage range detecting signal VRO and a first control signal HIGH_O. The frequency-change 20 detecting circuit 1620 compares the up signal UP and the down signal DN to generate a pulse signal FVO. Further, the frequency-change detecting circuit 1620 is controlled by the first control signal HIGH_O. The shift register 1630 generates the digital control signal D1 to Dn based on the voltage range detecting signal VRO and the pulse signal FVO.

Figure 8:
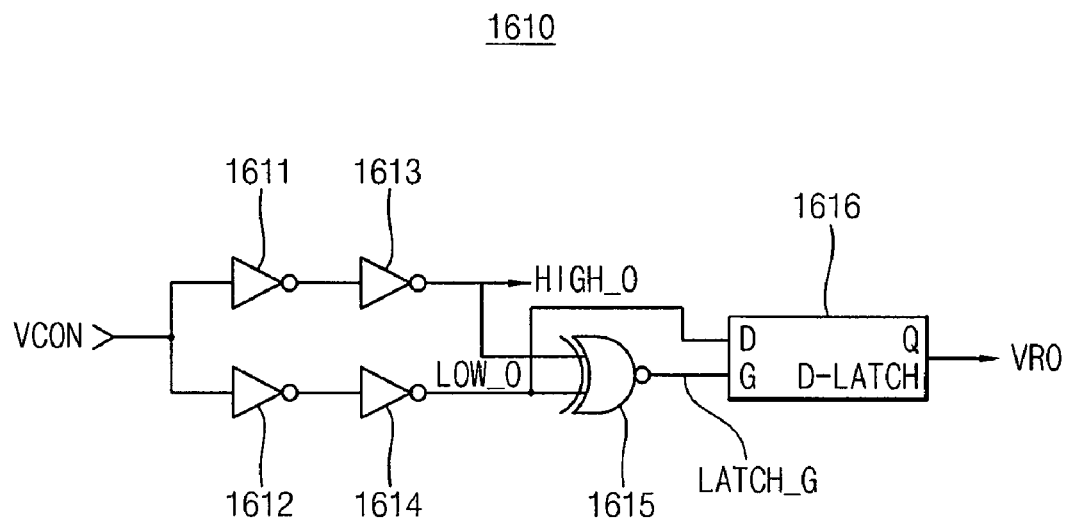
FIG. 8 is a circuit diagram illustrating an example embodiment of a control voltage range detecting circuit included in the control circuit of FIG. 7.

FIG. 8 is a circuit diagram illustrating an example embodiment of a control voltage range detecting circuit included in the control circuit of FIG. 7.

The control voltage range detecting circuit 1610 includes a first inverter 1611, a second inverter 1613, a third inverter 1612, a fourth inverter 1614, an exclusive-NOR (XNOR) gate 1615, and a latch circuit 1616.

The first inverter 1611 has a first transition threshold voltage that has a voltage level of the upper limit voltage VH, and inverts the oscillation-control voltage VCON. The second inverter 1613 inverts an output signal of the first inverter 1611. The third inverter has a second transition threshold voltage that has a voltage level of the lower limit voltage VL, and inverts the oscillation-control voltage VCON. The fourth inverter 1614 inverts an output signal of the third inverter 1612. The XNOR gate executes a logical XNOR operation on an output signal HIGH_O of the second inverter 1613 and the output signal LOW_O of the fourth inverter 1614. The latch circuit 1616 latches an output signal LOW_O of the fourth inverter 1614 in response to an output signal LATCH_G of the XNOR gate 1615.

Figure 9:
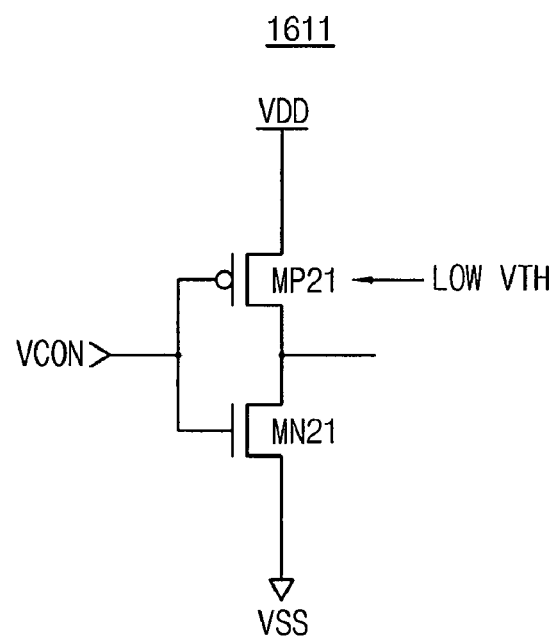
FIG. 9 and FIG. 10 are circuit diagrams illustrating example embodiments of inverters included in the control voltage range detecting circuit of FIG. 8.
Figure 10:
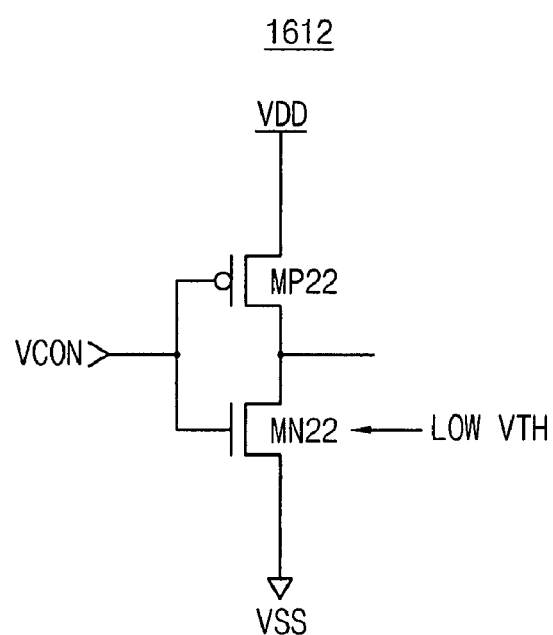

FIG. 9 and FIG. 10 are circuit diagrams illustrating example embodiments of inverters included in the control voltage range detecting circuit of FIG. 8.

The first inverter 1611 includes a tenth PMOS transistor MP21 and a thirteenth NMOS transistor MN21. The tenth PMOS transistor MP21 has a source to which the high supply voltage VDD is applied and a gate to which the oscillation-control voltage VCON is applied. The thirteenth NMOS transistor MN21 has a drain coupled to a drain of the tenth PMOS transistor MP21, a gate to which the oscillation-control voltage VCON is applied, and a source to which the low supply voltage VSS is applied.

The third inverter 1612 includes an eleventh PMOS transistor MP22 and a fourteenth NMOS transistor MN22. The eleventh PMOS transistor MP22 has a source to which the high supply voltage VDD is applied and a gate to which the oscillation-control voltage VCON is applied. The eleventh NMOS transistor MN22 has a drain coupled to a drain of the eleventh PMOS transistor MP22, a gate to which the oscillation-control voltage VCON is applied, and a source to which the low supply voltage VSS is applied.

The tenth PMOS transistor MP21 included in the first inverter 1611 has a threshold voltage that is lower than the threshold voltage of the eleventh PMOS transistor MP22 included in the third inverter 1612. Further, the eleventh NMOS transistor MN22 included in the third inverter 1612 has a threshold voltage that is lower than the threshold voltage of the thirteenth NMOS transistor MN21 included in the first inverter 1611. Therefore, the first inverter 1611 may have a transition threshold voltage having the same value as the upper limit voltage VH, and the third inverter 1612 may have a transition threshold voltage having the same value as the lower limit voltage VL.

Figure 11:
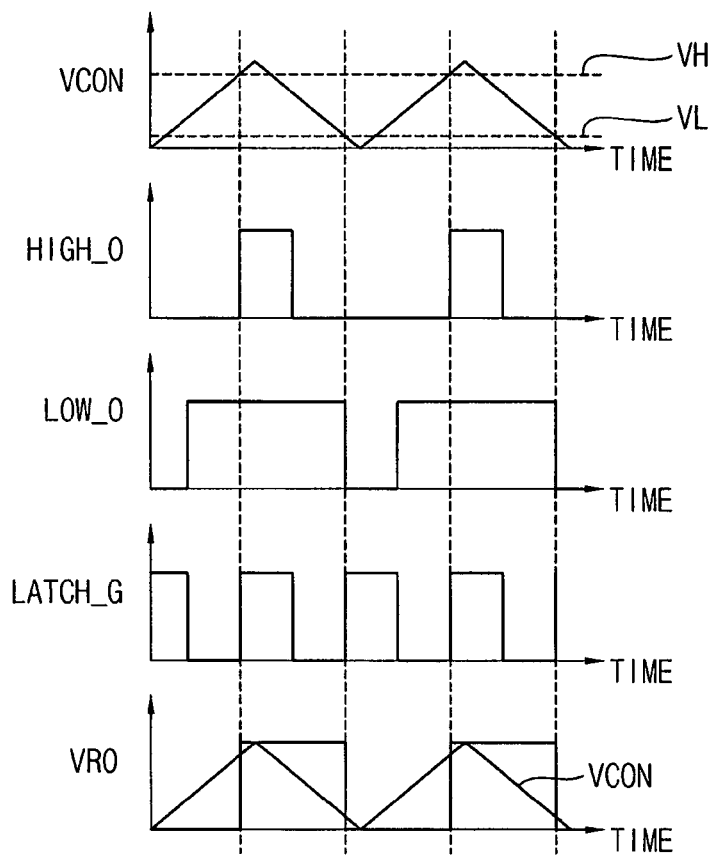
FIG. 11 is a timing diagram illustrating an operation of the control voltage range detecting circuit shown in FIG. 8.

FIG. 11 is a timing diagram illustrating an operation of the control voltage range detecting circuit shown in FIG. 8.

Hereinafter, operations of the control voltage range detecting circuit 1610 will be described with reference to FIG. 8 through FIG. 11.

The output signal VRO of the control voltage range detecting circuit 1610 determines whether code values of each of the digital control signals D1 to Dn has logic value of '1', a logic value of '0', or maintains the present state. The first inverter 1611 may have a transition threshold of the level of the upper limit voltage VH, and the third inverter 1612 may have a transition threshold of the level of the lower limit voltage VL. The upper limit voltage VH and the lower limit voltage VL have a relationship of 0<VL<VH<VDD. The second inverter 1613 and the fourth inverter 1614 restore a rising edge or a falling edge to assure the logic states, and have a transition threshold voltage of a value of about one half of the high supply voltage VDD.

Table 1 illustrates a truth table for the signals on the nodes in the control voltage range detecting circuit 1610 of FIG. 8.

TABLE 1

| VCON | HIGH_O | LOW_O | LATCH_G | VRO |
|---|---|---|---|---|
| VCON < VL | 0 | 0 | 1 | 0 |
| VL < VCON < VH | 0 | 1 | 0 | Q[n] |
| VCON > VH | 1 | 1 | 1 | 1 |

Referring to FIG. 11, the output signal VRO of the control voltage range detecting circuit 1610 becomes a logic value of '1' when the oscillation-control voltage VCON is greater than the upper limit voltage VH, and maintains a logic value of '1' until the oscillation-control voltage VCON is equal to the lower limit voltage VL. The output signal VRO of the control voltage range detecting circuit 1610 becomes a logic value of '0' when the oscillation-control voltage VCON is lower than the lower limit voltage VL, and maintains a logic value of '0' until the oscillation-control voltage VCON is greater than the upper limit voltage VH. That is, the output signal VRO of the control voltage range detecting circuit 1610 maintains the present state when the condition of VL<VCON<VH is satisfied.

Figure 12:
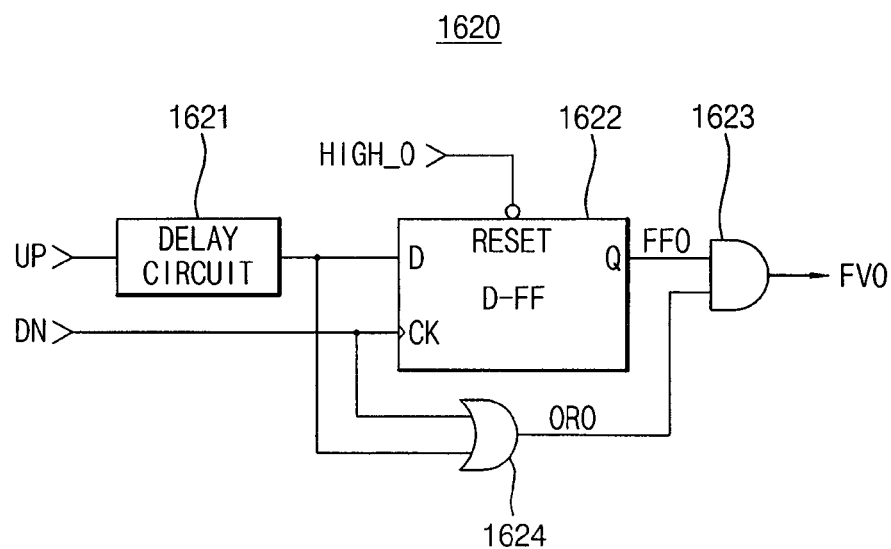
FIG. 12 is a circuit diagram illustrating an example embodiment of a frequency-change detecting circuit included in the control circuit of FIG. 7.

FIG. 12 is a circuit diagram illustrating an example embodiment of a frequency-change detecting circuit included in the control circuit of FIG. 7.

Referring to FIG. 12, the frequency-change detecting circuit 1620 includes a delay circuit 1621, a D-type flip-flop 1622, an OR gate 1624, and an AND gate 1623.

The delay circuit 1621 delays the up signal UP. The D-type flip-flop 1622 generates a first signal FFO having a logic "high" state when the output signal of the delay circuit 1621 is a logic "high" state in response to an edge of the down signal DN. Further, the D-type flip-flop 1622 is reset in response to the first control signal HIGH_O. The OR gate 1624 executes a logical OR operation on the output signal of the delay circuit 1621 and the down signal DN. The AND gate executes a logical AND operation on the first signal FFO and an output signal ORO of the OR gate 1624.

Figure 13:
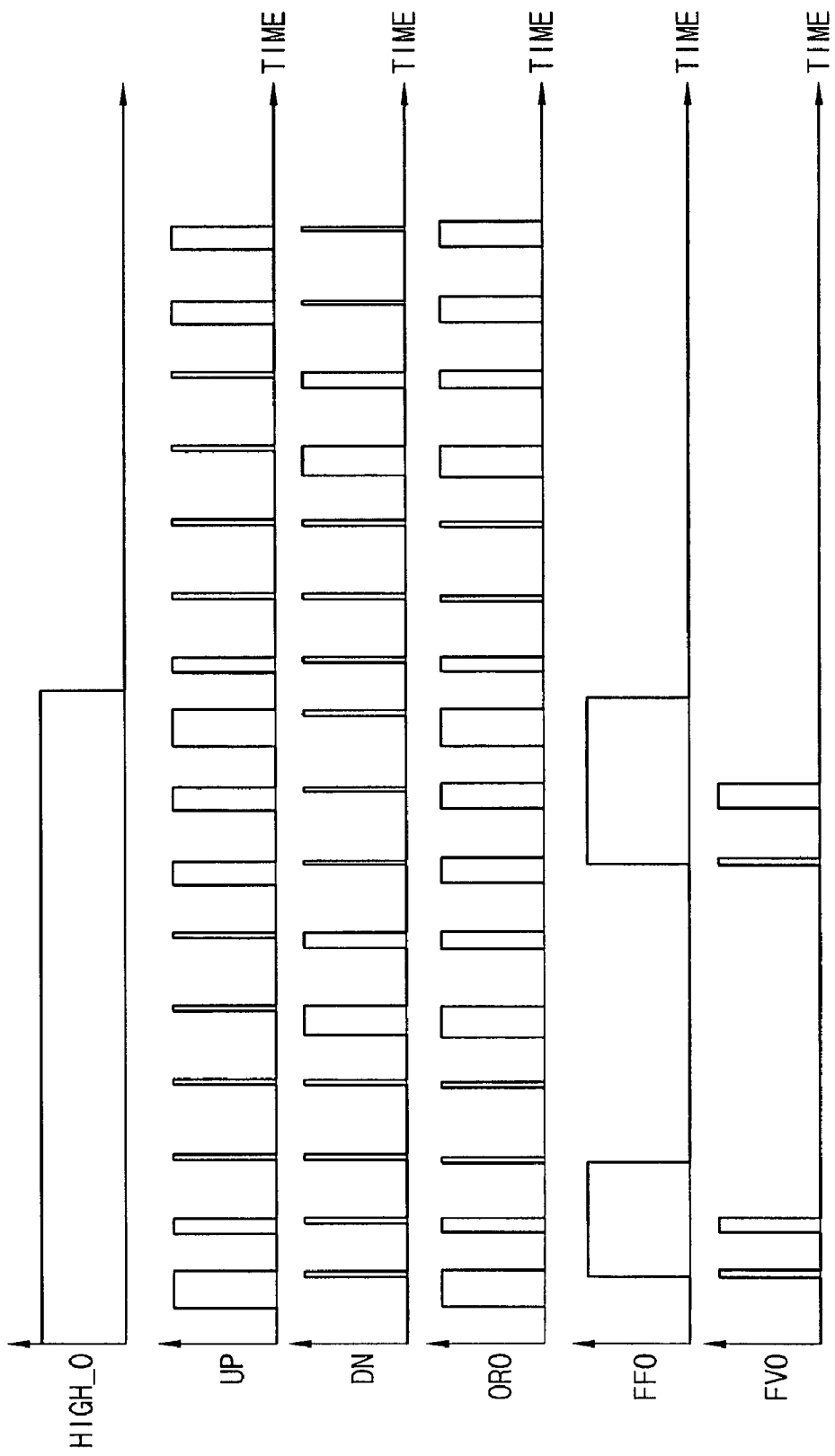
FIG. 13 is a timing diagram illustrating an operation of the frequency-change detecting circuit shown in FIG. 12.

FIG. 13 is a timing diagram illustrating an operation of the frequency-change detecting circuit shown in FIG. 12.

Hereinafter, operations of the frequency-change detecting circuit 1620 will be described with reference to FIG. 12 and FIG. 13.

It may be known indirectly whether the frequency of the oscillation-control voltage VCON is increasing or decreasing by using the logic state of the up signal UP and the down signal DN that are outputs of the PFD in FIG. 3. The up signal UP and the down signal DN are compared with each other. When a pulse width of the up signal UP is wider than the pulse width of the down signal DN, the oscillation-control voltage VCON is increasing. On the contrary, when a pulse width of the up signal UP is narrower than the pulse width of the down signal DN, the oscillation-control voltage VCON is decreasing.

The frequency-change detecting circuit 1620 of FIG. 12 compares pulse widths of the up signal UP and the down signal DN that are outputs of the PFD of FIG. 3. When the pulse width of the up signal UP is wider than the pulse width of the down signal DN, a pulse signal FVO is generated. The frequency-change detecting circuit 1620 of FIG. 12 operates only under the condition of VCON>VH. The D-type flip-flop 1622 is reset under the condition of VCON<VH.

Referring to FIG. 13, a pulse of the up signal UP and a pulse of the down signal DN may always exist even when a PLL is locked using a non-dead zone PFD, that is, when a pulse width of the up signal UP is the same as the pulse width of the down signal DN. The delay circuit 1621 delays the up signal UP by a certain time. In a case where the pulse width of the up signal UP is wider than a pulse width of the down signal DN by a delay time that is defined by the delay circuit 1621, a pulse is generated at the output node, that is the output terminal of the AND gate 1623. When the first control signal HIGH_O has a logic value of '1', the D-type flip-flop 1622 operates. Then the D-type flip-flop 1622 generates a pulse when the pulse width of the up signal UP is wider than the pulse width of the down signal DN. When the first control signal HIGH_O has a logic value of '0', the D-type flip-flop 1622 is reset and the pulse signal FVO has a logic value of '0' regardless of the states of the up signal UP and the down signal DN.

Figure 14:
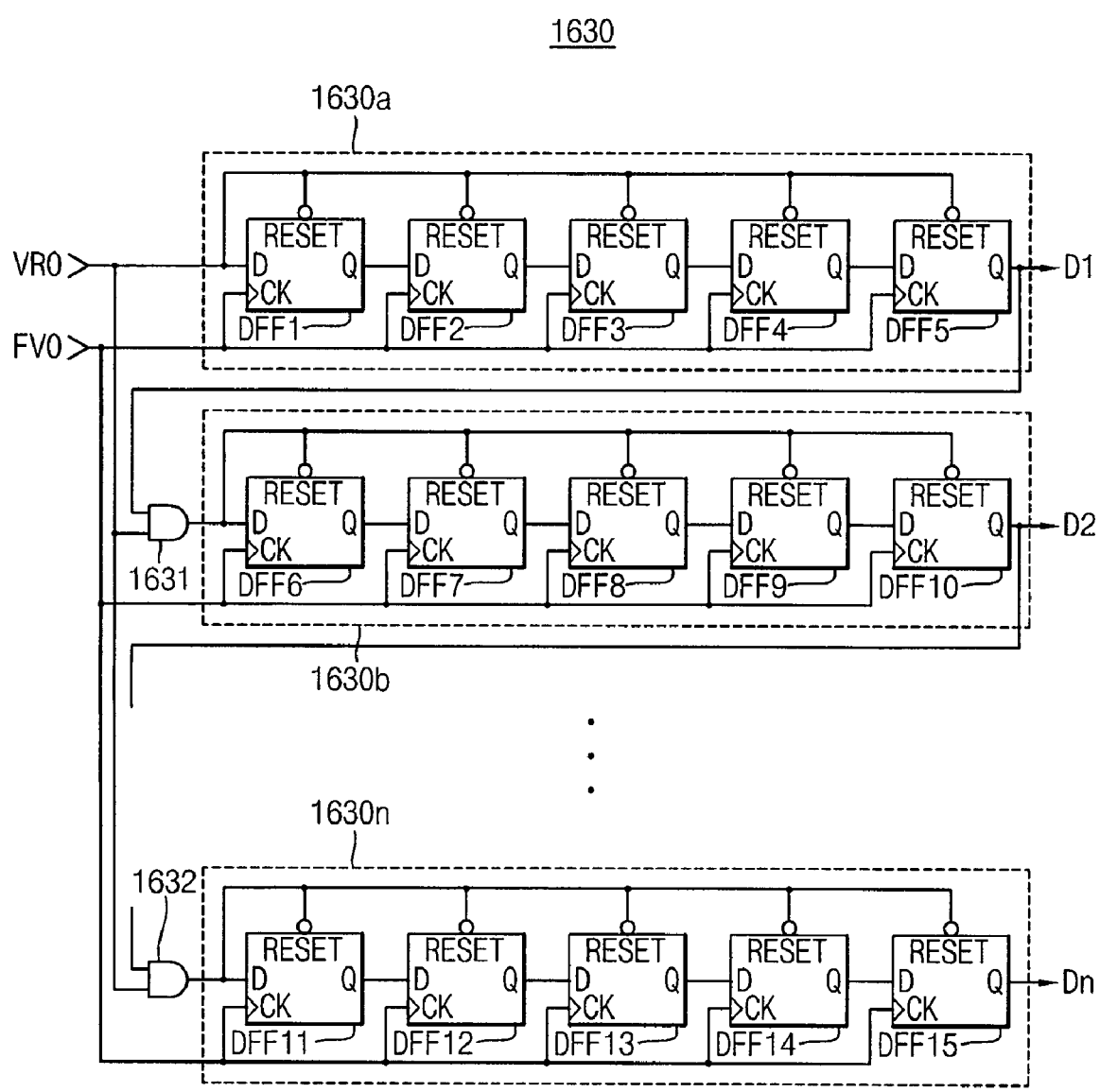
FIG. 14 is a circuit diagram illustrating an example embodiment of a shift register included in the control circuit of FIG. 7.

FIG. 14 is a circuit diagram illustrating an example embodiment of a shift register included in the control circuit of FIG. 7.

The shift register 1630 includes D-type flip-flops DFF1 to DFF15. The shift register 1630 includes a first counter 1630-1, a second counter 1630-2, an nth counter 1630-n, a first AND gate 1631, and a second AND gate 1632.

The outputs of the counters 1630-1 to 1630-n are digital control signals D1 to Dn. Each of the counters 1630-1 to 1630-n is comprised of five D-type flip-flops.

The first counter 1630-1 includes D-type flip-flops DFF1 to DFF5, and has an input terminal to which the output signal VRO of the control voltage range detecting circuit 1610 is applied. Further, the first counter 1630-1 has reset terminals. The output signal FVO of the frequency-change detecting circuit 1620 is applied to a clock terminal of the first counter 1630-1.

The first AND gate 1631 executes a logical AND operation on the output signal VRO of the control voltage range detecting circuit 1610 and the output signal D1 of the first counter 1630a.

The second counter 1630b includes D-type flip-flops DFF6 to DFF10, and has an input terminal to which an output signal of the AND gate 1631 is applied. Further, the second counter 1630b has reset terminals. The output signal FVO of the frequency-change detecting circuit 1620 is applied to a clock terminal of the second counter 1630b. The rest of the counters may have similar structures as the structure of the second counter 1630b.

The shift register 1630 of FIG. 14 counts the number of pulses of the output signal FVO of the frequency-change detecting circuit 1620, and outputs a logic value of '1' of the fifth pulse as Dn. At this time, all of the bits D1 to D[n−1] should maintain a logic value of '1', and the output signal VRO of the control voltage range detecting circuit 1610 maintains a logic value of '1' while five pulses are generated. In order for the signal Dn to change from a logic value of '0' to a logic value of '1', the output signal FVO of the frequency-change detecting circuit 1620 should have a pulse and the condition of VCON>VH should be satisfied. When Dn has a logic value of '1', the DN maintains a logic value of '1' until the condition of VCON<VL is satisfied.

Hereinafter, a process of VCO frequency tuning of the PLL according to the present invention will be described with reference to FIG. 3 to FIG. 14. Here, the VCO frequency refers to the frequency of an output signal of the VCO.

FIG. 4 and FIG. 5 illustrate graphs that represent VCO characteristics having three VCO tuning curves. One of the three tuning curves may be selected using digital signals having two bits D1 and D2.

FIG. 4 illustrates a process in which a trace of an output signal FOUT of a VCO 1400 shifts from a low frequency region to a high frequency region along frequency curves. At point P1, D1 and D2 have a logic value of '0'. When the trace approaches point P2 by the operation of PLL circuit, VRO and HIGH_O have a logic value of '1'. At point P2, the VCO frequency should be increased. Therefore, the period in which the pulse width of the up signal UP is wider than the pulse width of the down signal DN is generated in order for the oscillation-control voltage VCON to increase to a value greater than VH. The up signal UP and the down signal DN are compared more than five times. When a pulse of FVO is generated five times, D1 becomes a logic value of '1' and the trace moves to point P3 in FIG. 4. Also at point P3, a pulse of FVO is generated to increase the VCO. When a pulse of FVO is generated five times, D2 becomes a logic value of '1' and the trace moves to point P4 in FIG. 4. On the VCO curve in which D1 and D2 have a logic value of '1', the oscillation-control voltage VCON is decreased and the trace shifts to P5. At point P5, the condition of VL<VCON<VH is satisfied. Therefore, VRO maintains a logic value of '1' and HIGH_O has a logic value of '0'. The D-type flip-flop 1622 is reset and FVO maintains a logic value of '0'. Therefore, D1 and D2 maintain a state of a logic value of '1'.

FIG. 5 illustrates a process in which a trace of an output signal FOUT of a VCO 1400 shifts from a high frequency region to a low frequency region along frequency curves. At point P1 in FIG. 5, D1 and D2 have a logic value of '1'. The oscillation-control voltage VCON is decreased to shift to a target point. When the condition of VCON<VL is satisfied, VRO becomes a logic value of '0' and the flip-flops in FIG. 14 are reset. At this time, D1 and D2 become a logic value of '0' and the trace of an output signal FOUT of a VCO 1400 shifts to point P2. The process of shifting from point P2 to point P5 is similar to the process of FIG. 4. On the VCO curve in which D1 and D2 have a logic value of '0', the oscillation-control voltage VCON is increased to VH to increase the VCO frequency and the trace shifts to point P3. Also at point P3, the oscillation-control voltage VCON is increased to increase the VCO frequency. Therefore, the period in which the pulse width of the up signal UP is wider than the pulse width of the down signal DN is generated. A pulse of FVO is generated by the frequency-change detecting circuit 1620 while the VCO frequency is increased. When a pulse of FVO is generated five times, D1 becomes a logic value of '1' and the trace moves to point P4 in FIG. 5. On the VCO curve in which D1 and D2 have a logic value of '1', the oscillation-control voltage VCON is decreased to move to the target point. When the condition of VCON<VH is satisfied, HIGH_O has a logic value of '0'. Therefore, the D-type flip-flop 1622 is reset and FVO maintains a logic value of '0'. A pulse of FVO should be generated in order for the value of D2 to change. However, FVO maintains a logic value of '0' under the condition of VCON<VH and D2 maintains a logic value of '0'. Therefore, the PLL circuit is locked when D1 is a logic value of '1' and D2 is a logic value of '0'.

Referring to FIG. 4 through FIG. 14, a process of automatically tuning an oscillation frequency is as follows:

1. A step of comparing an oscillation-control voltage VCON and an upper limit voltage VH;

2. A step of setting an output signal VRO of a control voltage range detecting circuit 1610 to a logic value of '1' when the oscillation-control voltage VCON is greater than the upper limit voltage VH;

3. A step of comparing the oscillation-control voltage VCON and the lower limit voltage VL;

4. A step of setting the output signal VRO of the control voltage range detecting circuit 1610 to a logic value of '0' when the oscillation-control voltage VCON is lower than the lower limit voltage VL;

5. A step of maintaining a present logic state of the output signal VRO of the control voltage range detecting circuit 1610 when the oscillation-control voltage VCON is greater than or equal to the lower limit voltage VL;

6. A step of determining whether first to (N-1)th bits of a digital control signal D<1:N> have a logic value of '1', wherein N is a positive integer;

7. A step of setting an Nth bit of the digital control signal D<1:N> to a logic value of '0' when all of the first to (N-1)th bits of the digital control signal D<1:N> are not a logic value of '1';

8. A step of determining whether an output signal VRO of the control voltage range detecting circuit 1610 has a logic value of '1';

9. A step of setting the Nth bit of the digital control signal D<1:N> to a logic value of '0' when the output signal VRO of the control voltage range detecting circuit 1610 does not have a logic value of '1';

10. A step of determining whether the oscillation-control voltage VCON is greater than the upper limit voltage VH;

11. A step of setting the Nth bit of the digital control signal D<1:N> to a logic value of '1' when the oscillation-control voltage VCON is greater than the upper limit voltage VH;

12. A step of maintaining a present logic state of the Nth bit of the digital control signal D<1:N> when the oscillation-control voltage VCON is not greater than the upper limit voltage VH;

13. A step of adjusting an oscillation frequency of the VCO by applying the digital control signal D<1:N> to the VCO.

Figure 15:
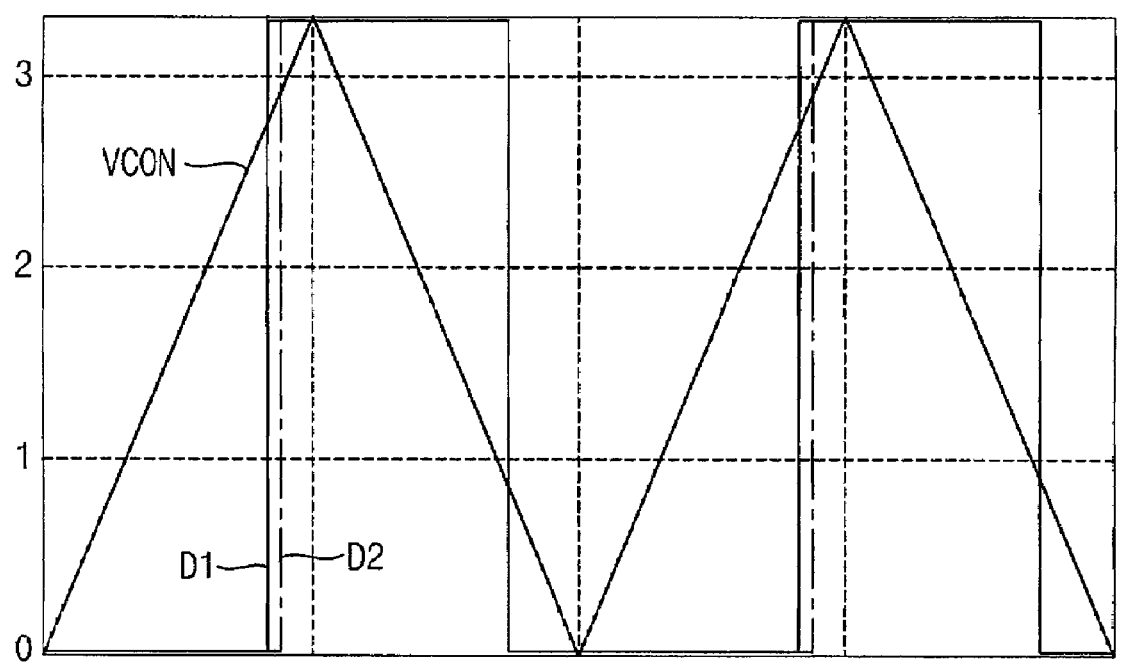
FIG. 15 is a simulation diagram illustrating the oscillation-control voltage provided to the control circuit of FIG. 7 and the digital codes that are output signals of the control circuit.

FIG. 15 is a simulation diagram illustrating the oscillation-control voltage VCON provided to the control circuit of FIG. 7 and the digital codes that are output signals of the control circuit.

Figure 16A:
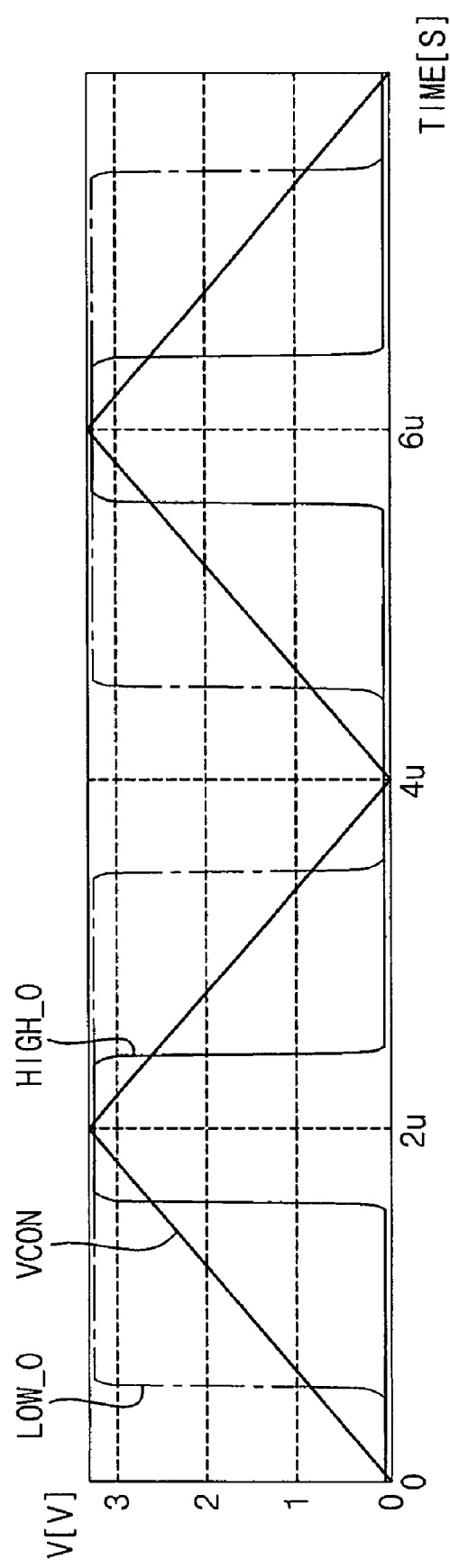
FIG. 16A, FIG. 16B, and FIG. 16C are simulation diagrams for the control voltage range detecting circuit shown in FIG. 8.
Figure 16B:
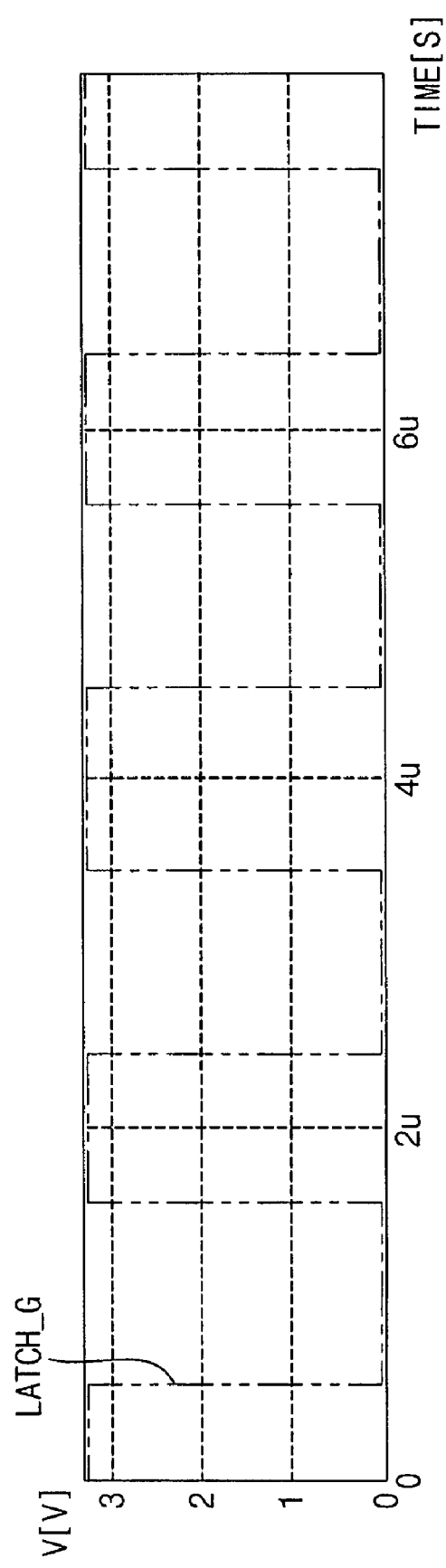
Figure 16C:
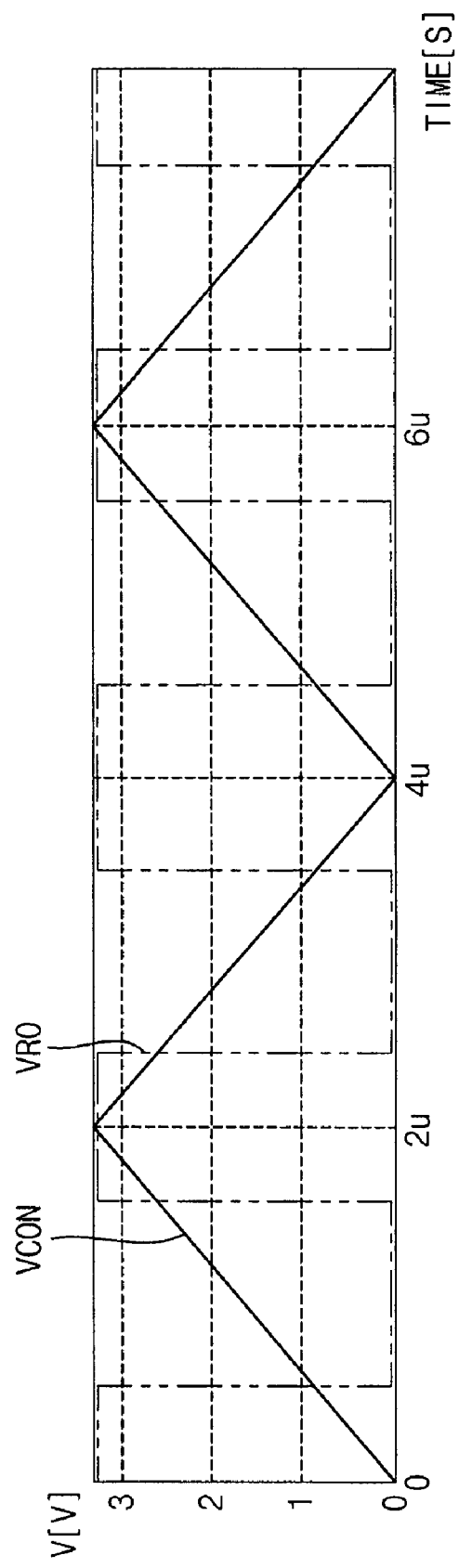

FIG. 16A, FIG. 16B, and FIG. 16C are simulation diagrams for the control voltage range detecting circuit shown in FIG. 8.

FIG. 17A, FIG. 17B, FIG. 17C, and FIG. 17D are simulation diagrams for the frequency-change detecting circuit shown in FIG. 12.

Figure 18A:
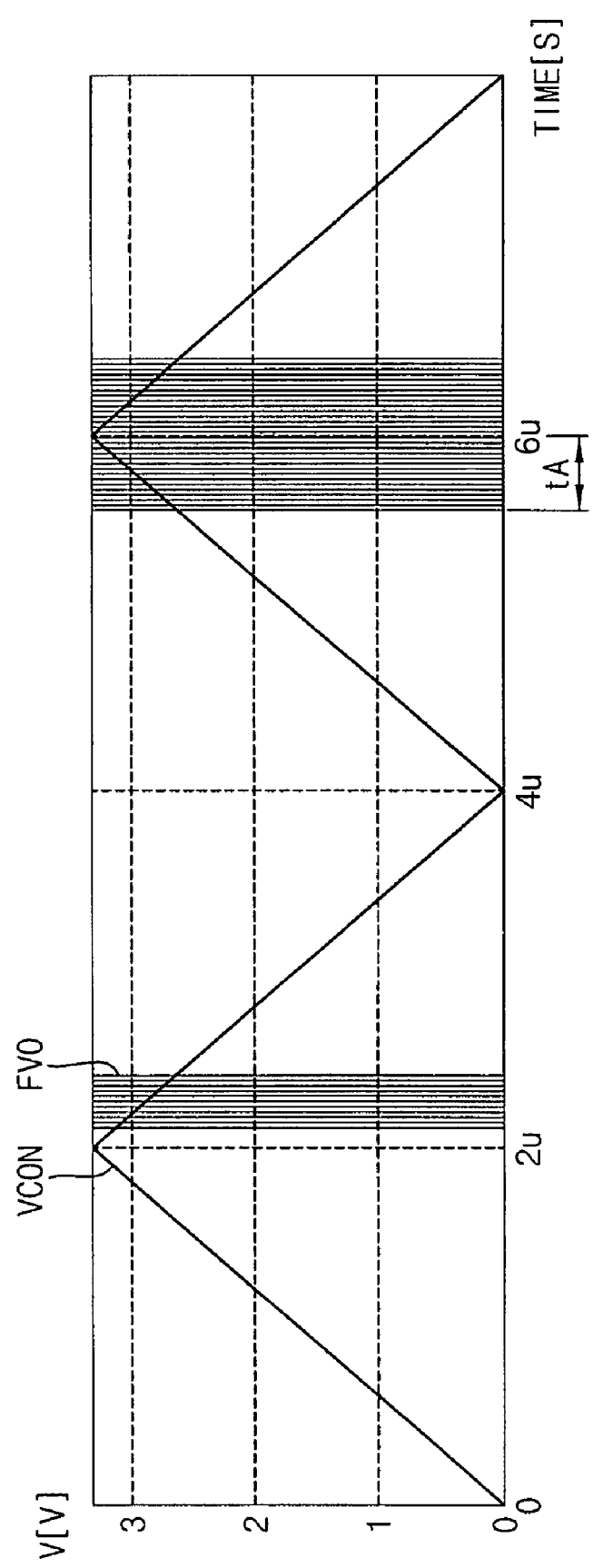
FIG. 18A, FIG. 18B, and FIG. 18C are simulation diagrams for the shift register shown in FIG. 14.
Figure 18B:
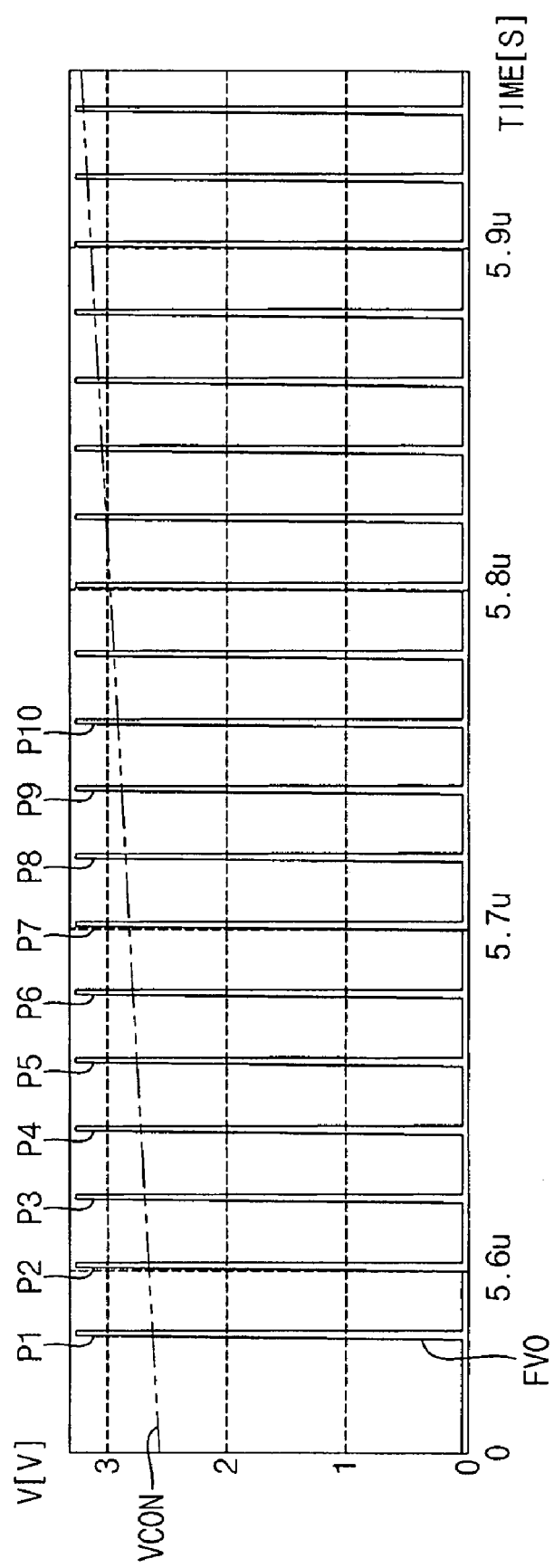
Figure 18C:
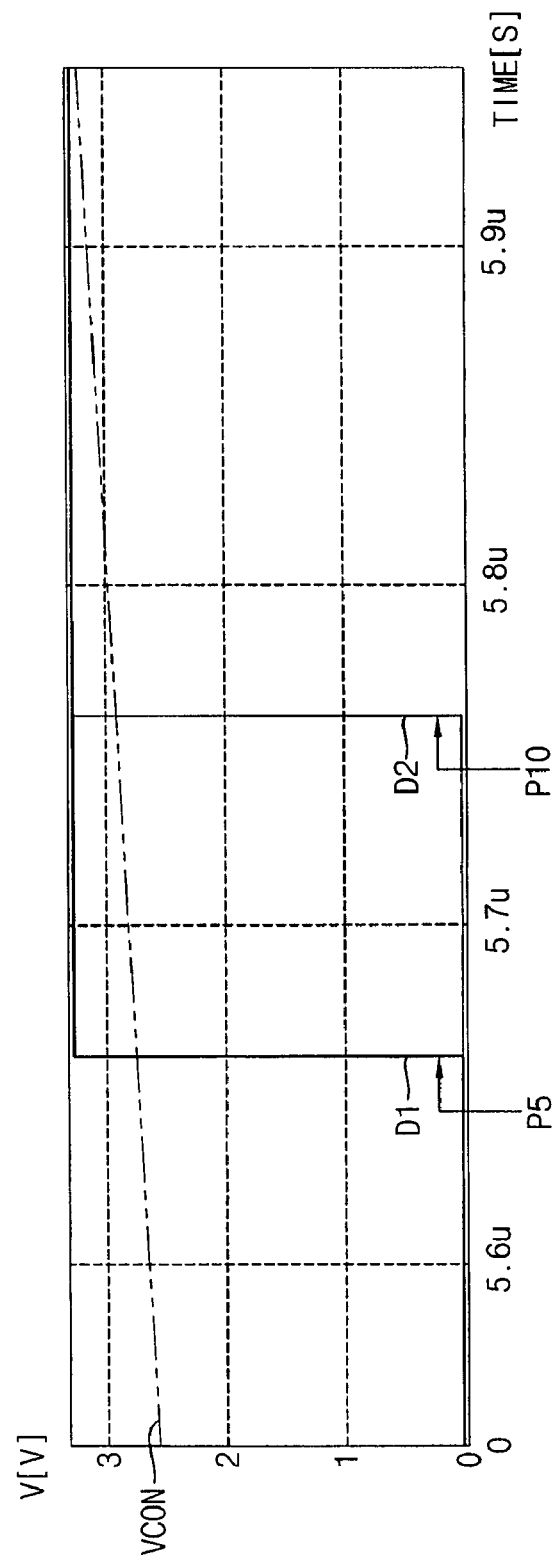

FIG. 18A, FIG. 18B, and FIG. 18C are simulation diagrams for the shift register shown in FIG. 14.

Figure 19A:
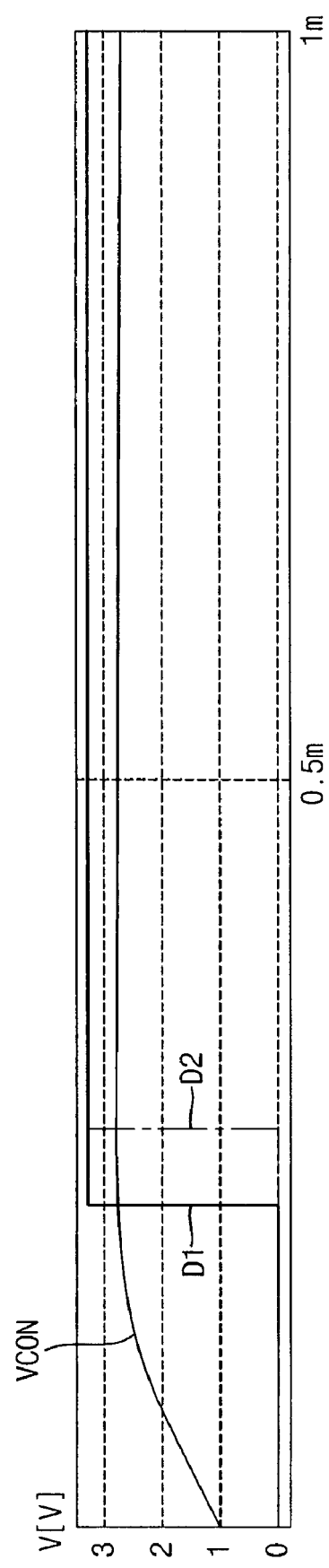
FIG. 19A, FIG. 19B, and FIG. 19C are simulation diagrams for the PLL circuit of FIG. 3.
Figure 19B:
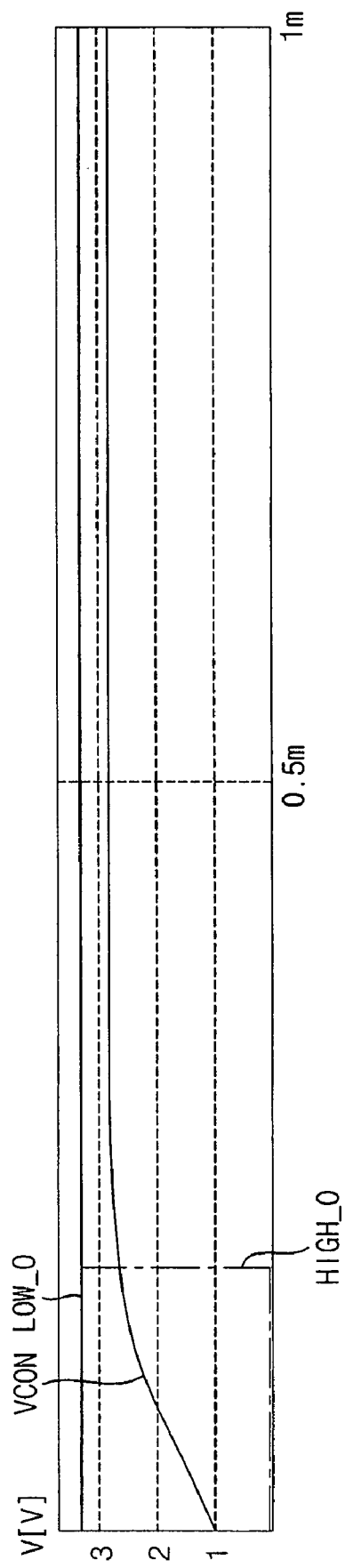
Figure 19C:
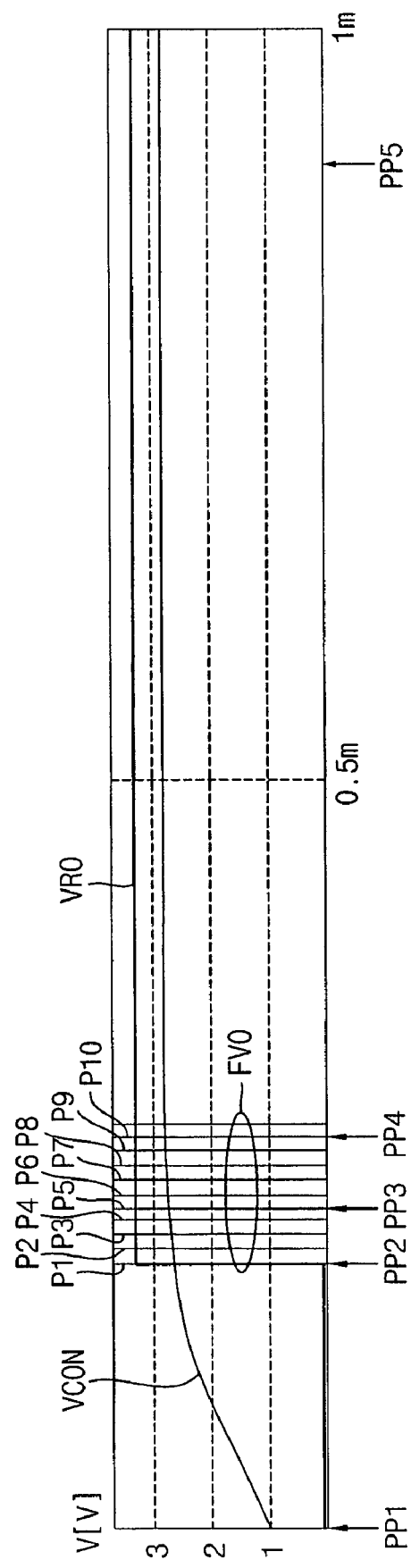

FIG. 19A, FIG. 19B, and FIG. 19C are simulation diagrams for the PLL circuit of FIG. 3.

FIG. 15, FIG. 16A, FIG. 16B, FIG. 16C, FIG. 17A, FIG. 17B, FIG. 17C, FIG. 17D, FIG. 18A, FIG. 18B, and FIG. 18C illustrate simulation results only for the control circuit VCO frequency tuning and the VCO. FIG. 19A, FIG. 19B, and FIG. 19C are simulation diagrams illustrating the PLL circuit in which the control circuit and the VCO are included. Further, FIG. 15, FIG. 16A, FIG. 16B, FIG. 16C, FIG. 17A, FIG. 17B, FIG. 17C, FIG. 17D, FIG. 18A, FIG. 18B, FIG. 18C, FIG. 19A, FIG. 19B, and FIG. 19C illustrate simulation results when the control circuit 1600 of FIG. 3 generates a digital control signal having two bits D1 and D2.

FIG. 15 illustrates waveforms of D1 and D2 when a triangular waveform is used as the oscillation-control voltage VCON and the pulse width of the up signal UP is wider than the down signal DN by 1 ns. The simulation was performed under the conditions in which the upper limit voltage VH is 2.7 V and the lower limit voltage VL is 0.9 V. When the oscillation-control voltage VCON approaches 2.7 V, D1 is changed into a logic value of '1'. After five cycles of up signal UP and the down signal DN are generated, D2 is changed into a logic value of '1'.

FIG. 16A, FIG. 16B, and FIG. 16C illustrate operations of the control voltage range detecting circuit 1610 shown in FIG. 8. In FIG. 8, a triangle waveform is used as the oscillation-control voltage VCON. It can be known that each of the waveforms is similar to the waveforms shown in FIG. 11.

Figure 17A:
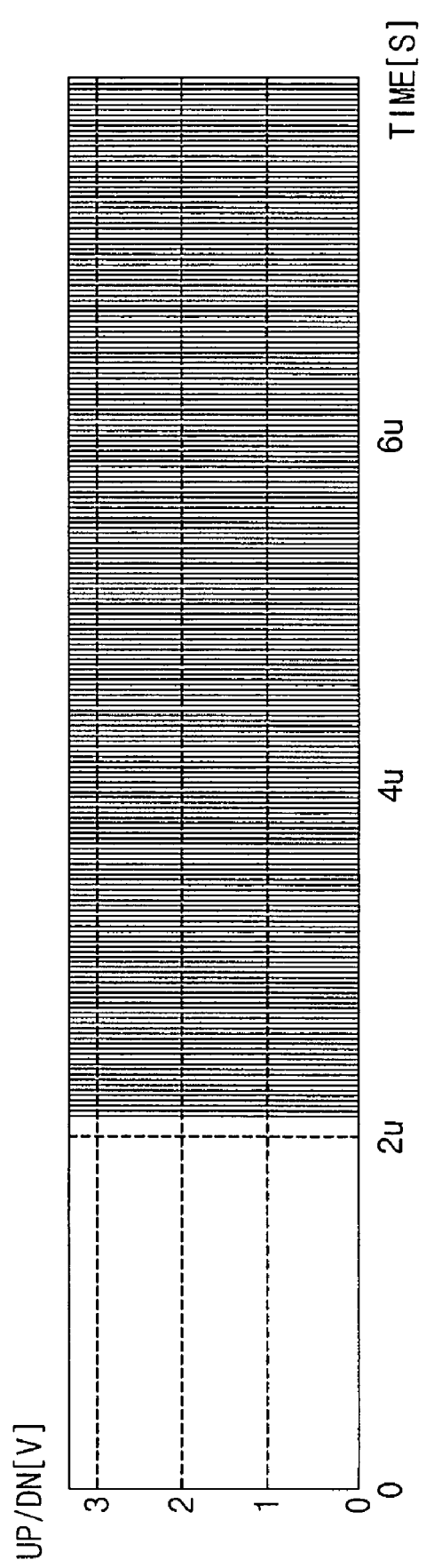
FIG. 17A, FIG. 17B, FIG. 17C, and FIG. 17D are simulation diagrams for the frequency-change detecting circuit shown in FIG. 12.
Figure 17B:
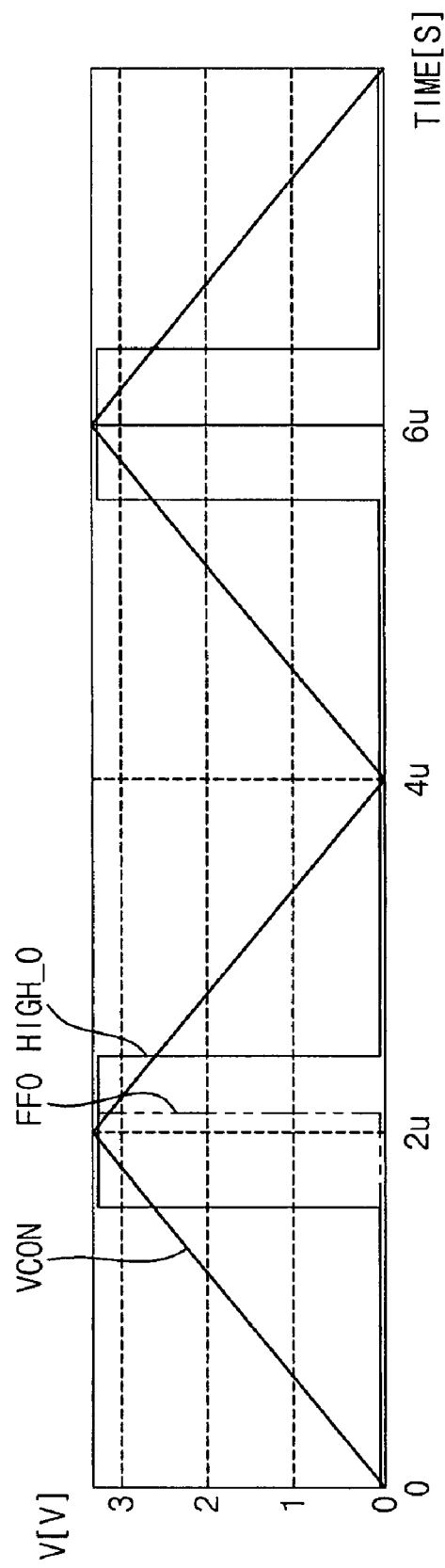
Figure 17C:
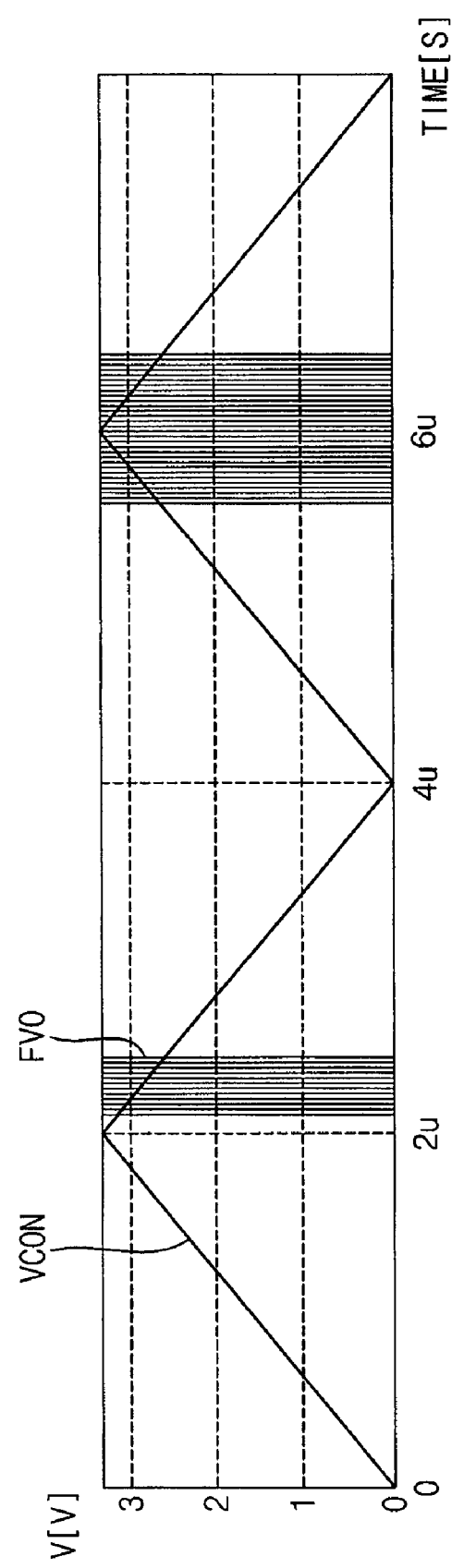
Figure 17D:
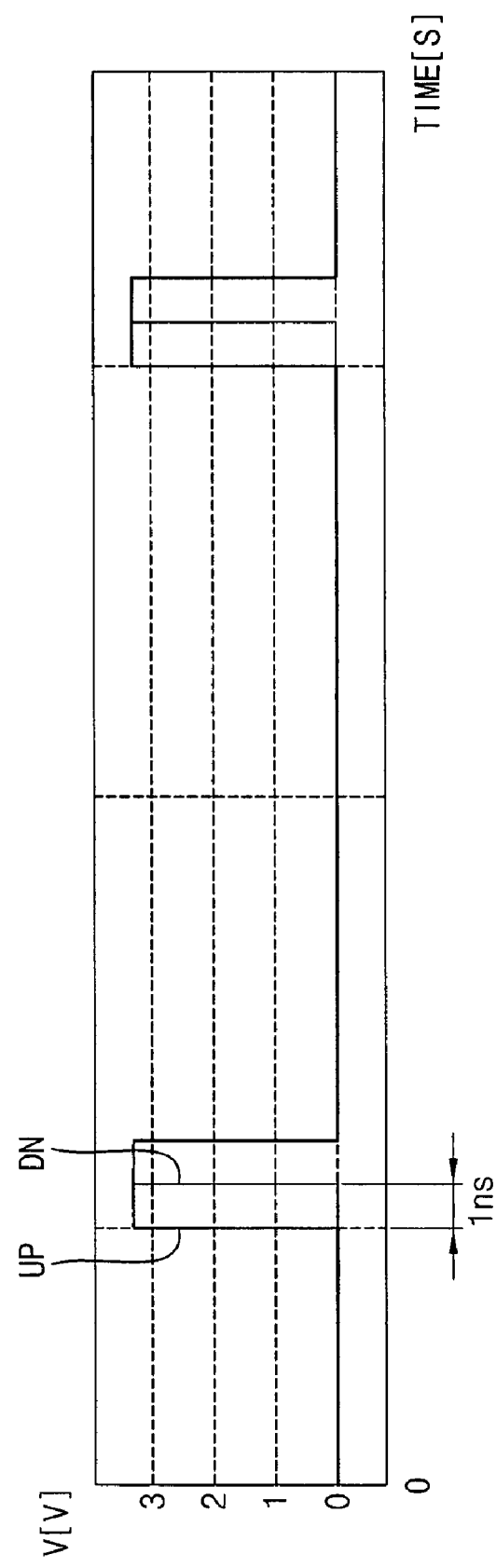

FIG. 17A, FIG. 17B, FIG. 17C, and FIG. 17D illustrate operations of the frequency-change detecting circuit 1620 shown in FIG. 12. As illustrated in FIG. 17D, The up signal UP is wider than the down signal DN by 1 ns. The up signal UP and the down signal DN are applied after 2.1 μs.

In FIG. 12, under the condition of VCON<VH, HIGH_O has a logic value of '0' and D-type flip-flop 1622 is reset. Therefore, the pulse signal FVO becomes a logic value of '0' even when the up signal UP is wider than the down signal DN. Even though the condition of VCON>VH is satisfied, ORO and the pulse signal FVO becomes a logic value of '0' when the up signal UP or the down signal DN does not exist.

As described above, the circuit of FIG. 7 generates the pulse signal FVO when the condition of VCON>VH is satisfied and pulse width of the up signal UP is wider than a pulse width of the down signal DN by a delay time that is defined by the delay circuit 1621.

FIG. 18A, FIG. 18B, FIG. 18C, and FIG. 18D illustrate operations of the shift register 1630 shown in FIG. 14. A series of pulses corresponding to the pulse signal FVO are generated when the condition of VCON>VH is satisfied and the oscillation-control voltage VCON is increasing. When a pulse signal FVO is generated five times, D1 becomes a logic value of '1'. When D1 is a logic value of '0', D-type flip-flops that are concerned with D2 become reset and D2 becomes a logic value of '0'. When D1 is logic "1", a pulse of FVO is generated successively because the oscillation-control voltage VCON is still increasing. When a pulse of FVO is generated five times, D2 becomes a logic value of '1'. This process is similar to the process of shifting from P2 to P4 in FIG. 4. If, as illustrated in FIG. 5, the oscillation-control voltage VCON is not increased further after D1 becomes a logic value of '1' and the state of VCON is changed into VCON<VH, the pulse signal FVO is not generated. Therefore, D1 and D2 maintain the present state. That is, D1 maintains a logic value of '1' and D2 maintains a logic value of '0'.

The simulation results shown in FIG. 19A, FIG. 19B, and FIG. 19C may be compared with the graph shown in FIG. 4. Points P1, P2, P3, P4, and P5 may correspond with points PP1, PP2, PP3, PP4, and PP5, respectively. At point PP1 in FIG. 19C, the oscillation-control voltage VCON starts with a voltage of 1.0 V. In particular, point PP1 in FIG. 19C does not exactly coincide with point P1 in FIG. 4. Point P1 in FIG. 4 is the point at which VCON<VL is satisfied, but point PP1 in FIG. 19C is the point at which VL<VCON<VH is satisfied. The oscillation-control voltage VCON is increased to point PP2 by the operation of a PLL circuit. At point PP2, HIGH_O and VRO become a logic value of '1'. After point PP2, the D-type flip-flop 1622 in FIG. 12 and five flip-flops DFF1 to DFF5 that are included in the path D1 are released from the reset state. The pulse signal FVO, which is a voltage on the output terminal of the AND gate 1623, includes five rising edges from points PP2 to PP3, and D1 changes to a logic value of '1' at the fifth rising edge as shown in FIG. 19a. VCON is still increasing at point PP3 at which D1 is a logic value of '1'. Therefore, a pulse of FVO is successively generated. D2 becomes a logic value of '1' at the fifth rising edge after point PP3. At point PP4, FVO becomes a logic value of '0' and VCON is decreased. At point PP5, the PLL circuit is locked.

When the PLL circuit is locked, the oscillation-control voltage VCON is under the condition of VL<VCON<VH. Therefore, the output signal VRO of the control voltage range detecting circuit 1610 maintains the present state, that is, a logic value of '1'. The pulse signal FVO, which is a voltage of the output terminal of the AND gate 1623, maintains a logic value of '0' because the condition of VCON<VH is satisfied. Therefore, D1 and D2, which are output signals of the shift register 1630 of FIG.7, maintain a logic value of '1'.

In the above example, a method of setting bits of the digital control signal to a logic value of '1' after a series of five pulses of the pulse signal FVO are generated is described. However, in another embodiment, bits of the digital control signal may be set to a logic value of '1' after an arbitrary number of pulses of the pulse signal FVO are generated.

Figure 20:
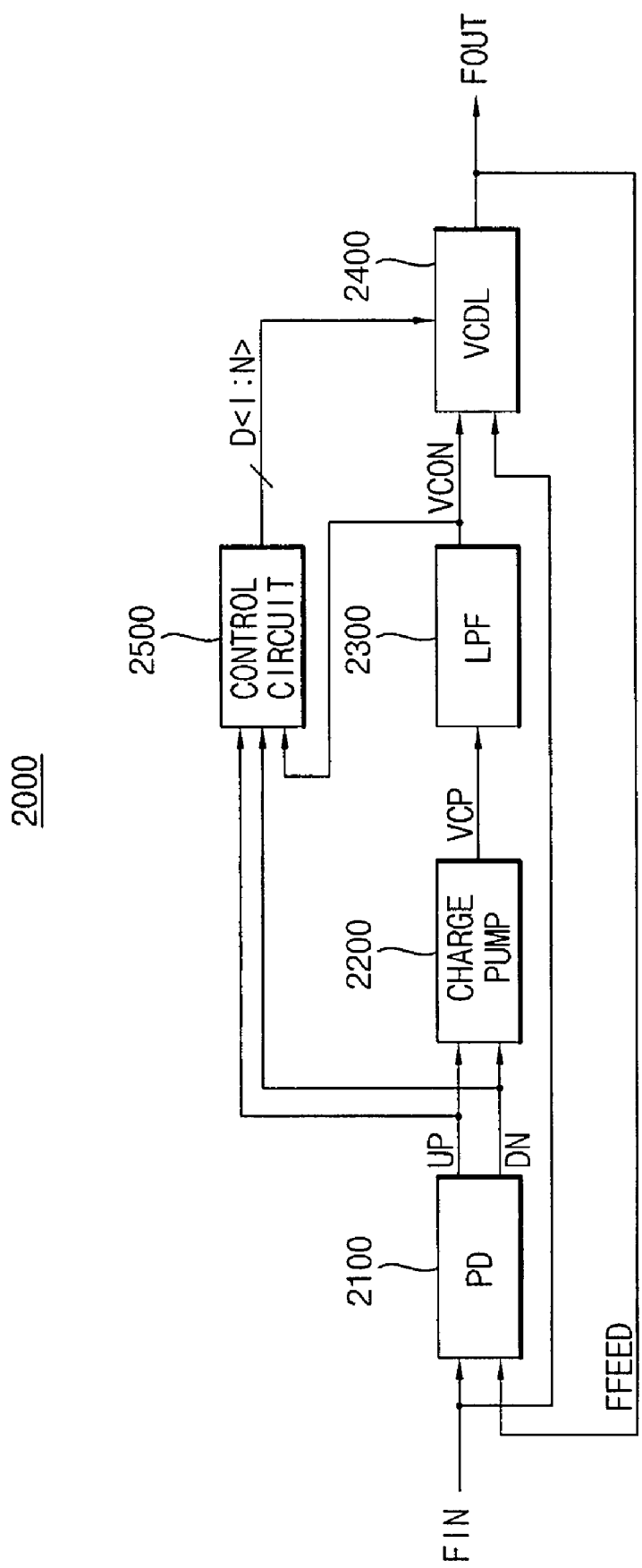
FIG. 20 is a block diagram illustrating a delay-locked loop (DLL) circuit according to an example embodiment of the present invention.

FIG. 20 is a block diagram illustrating a delay-locked loop (DLL) circuit according to an example embodiment of the present invention.

Referring to FIG. 20, the DLL circuit 2000 includes a phase detector 2100, a charge pump 2200, a loop filter 2300, a voltage-controlled delay line (VCDL) 2400, and a control circuit 2500.

The phase detector 2100 generates an up signal UP and down signal DN based on a phase difference between a reference signal FIN and a feedback signal FFEED. The charge pump 2200 generates a first voltage signal VCP that changes in response to the up signal UP and the down signal DN. The loop filter 2300 filters the first voltage signal VCP to generate an oscillation-control voltage VCON. The voltage-controlled delay line 2400 generates an output signal FOUT. A delay time of the output signal FOUT is changed based on the oscillation-control voltage VCON and the digital control signal D<1:N>. The feedback signal FFEED is a signal that corresponds to a fed back signal of the output signal FOUT, and is applied to an input terminal of the PD. The control circuit 2500 generates a digital control signal D<1:N> based on the up signal UP, the down signal DN, and the oscillation-control voltage VCON.

The simulation results for the PLL circuit 1000 described above may be adapted to the DLL circuit 2000 shown in FIG. 20. The operation of the delayed-locked-loop circuit 2000 of FIG. 20 is similar to the operation of the PLL circuit 1000 of FIGS. 3 through 19.

As described above, the PLL circuit and the DLL circuit according to the embodiments of the present invention include a control circuit that automatically tunes the oscillation frequency of the output signal of the VCO. Further, the PLL circuit and the DLL circuit according to the embodiments of the present invention can guarantee operation at a maximum frequency and a minimum frequency regardless of the changes in operating conditions by automatically controlling the bit values of the digital control signal in response to the operating conditions. Further, the PLL circuit and the DLL circuit according to the embodiments of the present invention can automatically tune the frequency of the output signal of a VCO or a voltage-controlled delay line using a digital circuit having a simple structure.

While the example embodiments of the present invention and their advantages have been described in detail, it should be understood that various changes, substitutions and alterations may be made herein without departing from the scope of the invention.

What is claimed is:

1. A phase-locked loop (PLL) circuit comprising:
a phase/frequency detector (PFD) configured to generate an up signal and a down signal in response to a phase difference or a frequency difference between a reference signal and a feedback signal;

a charge pump configured to generate a first voltage signal that is changed in response to the up signal and the down signal;

a loop filter configured to filter the first voltage signal to generate an oscillation- control voltage;

a control circuit configured to generate a digital control signal in response to the up signal, the down signal, and the oscillation-control voltage, the control circuit comprising a control voltage range detecting circuit configured to set an upper limit voltage and a lower limit voltage in response to a threshold voltage of a metal-oxide semiconductor (MOS) transistor and to compare the oscillation-control voltage with the upper limit voltage and the lower limit voltage to generate a voltage range detecting signal used to enable the digital control signal;

a voltage-controlled oscillator (VCO) configured to generate an output signal, a frequency of the output signal being changed in response to the oscillation-control voltage and the digital control signal; and a feedback circuit configured to generate the feedback signal in response to the output signal.

2. The PLL circuit of claim 1, wherein the control circuit further comprises:

a frequency-change detecting circuit configured to compare the up signal and the down signal to generate a pulse signal; and a shift register configured to generate the digital control signal in response to the voltage range detecting signal and the pulse signal.

3. The PLL circuit of claim 2, wherein the frequency-change detecting circuit is configured to generate the pulse signal when a pulse width of the up signal is wider than a pulse width of the down signal.

4. The PLL circuit of claim 2, wherein the voltage range detecting signal has a first logic state when the oscillation control signal has a voltage lower than the lower limit voltage and a second logic state when the oscillation control signal has a voltage greater than the upper limit voltage, and wherein the voltage range detecting signal maintains a previous logic state when the oscillation control signal has a voltage greater than or equal to the lower limit voltage or when the oscillation control signal has a voltage lower than or equal to the upper limit voltage.

5. The PLL circuit of claim 1, wherein the control voltage range detecting circuit comprises:

a first inverter having a first transition threshold voltage substantially the same as the upper limit voltage, and configured to invert the oscillation-control voltage;

a second inverter configured to invert an output signal of the first inverter;

a third inverter having a second transition threshold voltage substantially the same as the lower limit voltage, and configured to invert the oscillation-control voltage;

a fourth inverter configured to invert an output signal of the third inverter;

an XNOR gate configured to execute a logical XNOR operation on an output signal of the second inverter and the output signal of the fourth inverter; and a latch circuit configured to latch an output signal of the fourth inverter in response to an output signal of the XNOR gate.

6. The PLL circuit of claim 5, wherein the first inverter includes a first PMOS transistor and a first NMOS transistor, and the second inverter includes a second PMOS transistor and a second NMOS transistor, the first PMOS transistor having a threshold voltage lower than the threshold voltage of the second PMOS transistor, the second NMOS transistor having a threshold voltage lower than the threshold voltage of the first NMOS transistor.

7. A phase-locked loop (PLL), comprising:

a phase/frequency detector (PFD) configured to generate an up signal and a down signal in response to a phase difference or a frequency difference between a reference signal and a feedback signal;

a charge pump configured to generate a first voltage signal that is changed in response to the up signal and the down signal;

a loop filter configured to filter the first voltage signal to generate an oscillation-control voltage;

a control circuit configured to generate a digital control signal in response to the up signal, the down signal, and the oscillation-control voltage;

a voltage-controlled oscillator (VCO) configured to generate an output signal, a frequency of the output signal being changed in response to the oscillation-control voltage and the digital control signal; and a feedback circuit configured to generate the feedback signal in response to the output signal, wherein the control circuit comprises:

a control voltage range detecting circuit configured to set an upper limit voltage and a lower limit voltage and to compare the oscillation-control voltage with the upper limit voltage and the lower limit voltage to generate a voltage range detecting signal;

a frequency-change detecting circuit configured to compare the up signal and the down signal to generate a pulse signal, wherein the frequency-change detecting circuit comprises:

a delay circuit configured to delay the up signal;

a flip-flop configured to generate a first signal in response to the down signal and an output signal of the delay circuit;

an OR gate configured to execute a logical OR operation on the output signal of the delay circuit and the down signal; and an AND gate configured to execute a logical AND operation on the first signal and an output signal of the OR gate; and a shift register configured to generate the digital control signal in response to the voltage range detecting signal and the pulse signal.

8. The PLL circuit of claim 1, wherein the VCO comprises:

a bias circuit configured to generate a bias voltage that is changed in response to the oscillation-control voltage;

a compensating circuit configured to change the bias voltage in response to the digital control signal; and an oscillating circuit configured to generate the output signal in response to the bias voltage.

9. A phase-locked loop (PLL), comprising:

a phase/frequency detector (PFD) configured to generate an up signal and a down signal in response to a phase difference or a frequency difference between a reference signal and a feedback signal;

a charge pump configured to generate a first voltage signal that is changed in response to the up signal and the down signal;

a loop filter configured to filter the first voltage signal to generate an oscillation-control voltage;

a control circuit configured to generate a digital control signal in response to the up signal, the down signal, and the oscillation-control voltage;

a voltage-controlled oscillator (VCO) configured to generate an output signal, a frequency of the output signal being changed in response to the oscillation-control voltage and the digital control signal; and a feedback circuit configured to generate the feedback signal in response to the output signal, wherein the VCO comprises:

a bias circuit configured to generate a bias voltage that is changed in response to the oscillation-control voltage;

a compensating circuit configured to change the bias voltage in response to the digital control signal; and an oscillating circuit configured to generate the output signal in response to the bias voltage, and wherein the compensating circuit comprises:

at least one current source having a first terminal to which a first supply voltage is applied; and at least one switch coupled between a second terminal of each of the at least one current sources and the bias circuit, and configured to be turned on in response to one bit of the digital control signal.

10. A voltage-controlled oscillator (VCO) comprising:

a control circuit configured to generate a digital control signal in response to an up signal, a down signal, and an oscillation-control voltage;

a bias circuit configured to generate a bias voltage that is changed in response to the oscillation-control voltage;

a compensating circuit configured to change the bias voltage in response to the digital control signal, wherein the compensating circuit comprises:

at least one current source having a first terminal to which a first supply voltage is applied; and at least one switch coupled between a second terminal of each of the at least one current sources and the bias circuit, and configured to be turned on in response to one bit of the digital control signal; and an oscillating circuit configured to generate an output signal, a frequency of the output signal being changed in response to the bias voltage.

11. The VCO of claim 10, wherein the control circuit comprises:

a control voltage range detecting circuit configured to set an upper limit voltage and a lower limit voltage and to compare the oscillation-control voltage with the upper limit voltage and the lower limit voltage to generate a voltage range detecting signal;

a frequency-change detecting circuit configured to compare the up signal and the down signal to generate a pulse signal; and a shift register configured to enable the digital control signal in response to the voltage range detecting signal and the pulse signal.

12. The VCO of claim 11, wherein the frequency-change detecting circuit is configured to generate the pulse signal when a pulse width of the up signal is wider than a pulse width of the down signal.

13. A voltage-controlled oscillator (VCO), comprising:

a control circuit configured to generate a digital control signal in response to an up signal, a down signal, and an oscillation-control voltage, the control circuit comprising a control voltage range detecting circuit configured to set an upper limit voltage and a lower limit voltage, wherein the upper limit voltage and the lower limit voltage are set in response to a threshold voltage of a metal-oxide semiconductor (MOS) transistor, and to compare the oscillation-control voltage with the upper limit voltage and the lower limit voltage to generate a voltage range detecting signal used to enable the digital control signal;

a bias circuit configured to generate a bias voltage that is changed in response to the oscillation-control voltage;

a compensating circuit configured to change the bias voltage in response to the digital control signal; and an oscillating circuit configured to generate an output signal, a frequency of the output signal being changed in response to the bias voltage.

14. The VCO of claim 11, wherein the voltage range detecting signal has a first logic state when the oscillation control signal has a voltage lower than the lower limit voltage and a second logic state when the oscillation control signal has a voltage greater than the upper limit voltage, and wherein the voltage range detecting signal maintains a previous logic state when the oscillation control signal has a voltage greater than or equal to the lower limit voltage or when the oscillation control signal has a voltage lower than or equal to the upper limit voltage.

15. A voltage-controlled oscillator (VCO), comprising:

a control circuit configured to generate a digital control signal in response to an up signal, a down signal, and an oscillation-control voltage, the control circuit comprising a control voltage range detecting circuit configured to set an upper limit voltage and a lower limit voltage and to compare the oscillation-control voltage with the upper limit voltage and the lower limit voltage to generate a voltage range detecting signal;

a bias circuit configured to generate a bias voltage that is changed in response to the oscillation-control voltage;

a compensating circuit configured to change the bias voltage in response to the digital control signal; and an oscillating circuit configured to generate an output signal, a frequency of the output signal being changed in response to the bias voltage, wherein the control voltage range detecting circuit comprises:

a first inverter having a first transition threshold voltage substantially the same as the upper limit voltage, and configured to invert the oscillation-control voltage;

a second inverter configured to invert an output signal of the first inverter;

a third inverter having a second transition threshold voltage substantially the same as the lower limit voltage, and configured to invert the oscillation- control voltage;

a fourth inverter configured to invert an output signal of the third inverter;

an XNOR gate configured to execute a logical XNOR operation on an output signal of the second inverter and the output signal of the third inverter; and a latch circuit configured to latch an output signal of the fourth inverter in response to an output signal of the XNOR gate.

16. The VCO of claim 15, wherein the first inverter includes a first PMOS transistor and a first NMOS transistor, and the second inverter includes a second PMOS transistor and a second NMOS transistor, the first PMOS transistor having a threshold voltage lower than the threshold voltage of the second PMOS transistor, the second NMOS transistor having a threshold voltage lower than the threshold voltage of the first NMOS transistor.

17. A voltage-controlled oscillator (VCO), comprising:

a control circuit configured to generate a digital control signal in response to an up signal, a down signal, and an oscillation-control voltage, the control circuit comprising a frequency-change detecting circuit configured to compare the up signal and the down signal to generate a pulse signal used to enable the digital control signal;

a bias circuit configured to generate a bias voltage that is changed in response to the oscillation-control voltage;

a compensating circuit configured to change the bias voltage in response to the digital control signal; and an oscillating circuit configured to generate an output signal, a frequency of the output signal being changed in response to the bias voltage, wherein the frequency-change detecting circuit comprises:
a delay circuit configured to delay the up signal;
a flip-flop configured to generate a first signal in response to the down signal and an output signal of the delay circuit;
an OR gate configured to execute a logical OR operation on the output signal of the delay circuit and the down signal; and
an AND gate configured to execute a logical AND operation on the first signal and an output signal of the OR gate.

18. A method of controlling a PLL circuit, the method comprising:

generating an up signal and down signal in response to a phase difference or a frequency difference between a reference signal and a feedback signal;

generating a first voltage signal that is changed in response to the up signal and the down signal;

filtering the first voltage signal to generate an oscillation-control voltage;

generating a digital control signal in response to the up signal, the down signal, and the oscillation-control voltage, including setting an upper limit voltage and a lower limit voltage in response to a threshold voltage of a metal-oxide semiconductor (MOS) transistor and comparing the oscillation-control voltage with the upper limit voltage and the lower limit voltage to generate a voltage range detecting signal used to enable the digital control signal;

generating an output signal by controlling a frequency of the output signal in response to the oscillation-control voltage and the digital control signal; and generating the feedback signal in response to the output signal.

19. A method of tuning an oscillation frequency, the method comprising:

setting an upper limit voltage and a lower limit voltage based on a threshold voltage of a metal-oxide semiconductor (MOS) transistor;

comparing an oscillation-control voltage with the upper limit voltage;

setting an output signal of a control voltage range detecting circuit to a logic value of '1' when the oscillation-control voltage is greater than the upper limit voltage;

comparing the oscillation-control voltage with the lower limit voltage;

setting the output signal of the control voltage range detecting circuit to a logic value of '0' when the oscillation-control voltage is lower than the lower limit voltage;

maintaining a present logic state of the output signal of the control voltage range detecting circuit when the oscillation-control voltage is greater than or equal to the lower limit voltage;

determining whether first to (N-1)th bits of a digital control signal of N-bit have a logic value of '1' where N is a positive integer;

setting an Nth bit of the digital control signal to a logic value of '0' when all of the first to (N-1)th bits of the digital control signal are not a logic value of '1';

determining whether an output signal of the control voltage range detecting circuit has a logic value of '1';

setting the Nth bit of the digital control signal to a logic value of '0' when the output signal of the control voltage range detecting circuit does not have a logic value of '1';

determining whether the oscillation-control voltage is greater than the upper limit voltage;

setting the Nth bit of the digital control signal to a logic value of '1' when the oscillation-control voltage is greater than the upper limit voltage; and maintaining a present logic state of the Nth bit of the digital control signal when the oscillation-control voltage is not greater than the upper limit voltage.

20. The method of claim 19 further comprising:
tuning the oscillation frequency by applying the digital control signal to the VCO.

21. A delay-locked loop (DLL) circuit comprising:

a phase detector configured to generate an up signal and down signal in response to a phase difference between a reference signal and a feedback signal;

a charge pump configured to generate a first voltage signal that is changed in response to the up signal and the down signal;

a loop filter configured to filter the first voltage signal to generate an oscillation-control voltage;

a control circuit configured to generate a digital control signal in response to the up signal, the down signal, and the oscillation-control voltage, the control circuit comprising a control voltage range detecting circuit configured to set an upper limit voltage and a lower limit voltage in response to a threshold voltage of a metal-oxide semiconductor (MOS) transistor and to compare the oscillation-control voltage with the upper limit voltage and the lower limit voltage to generate a voltage range detecting signal used to enable the digital control signal; and a voltage-controlled delay line configured to generate an output signal, a delay time of the output signal being changed in response to the oscillation-control voltage and the digital control signal; and a feedback path configured to generate the feedback signal in response to the output signal.

* * * * *